(12) United States Patent
Wei et al.

(10) Patent No.: US 8,957,399 B2
(45) Date of Patent: Feb. 17, 2015

(54) NONVOLATILE MEMORY ELEMENT AND NONVOLATILE MEMORY DEVICE

(71) Applicant: Panasonic Intellectual Property Management Co., Ltd., Osaka (JP)

(72) Inventors: Zhiqiang Wei, Osaka (JP); Takeshi Takagi, Kyoto (JP); Koji Katayama, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 32 days.

(21) Appl. No.: 13/995,383

(22) PCT Filed: Oct. 22, 2012

(86) PCT No.: PCT/JP2012/006734
§ 371 (c)(1),
(2) Date: Jun. 18, 2013

(87) PCT Pub. No.: WO2013/061559
PCT Pub. Date: May 2, 2013

(65) Prior Publication Data
US 2014/0061579 A1    Mar. 6, 2014

(30) Foreign Application Priority Data
Oct. 24, 2011    (JP) .................................. 2011-233306

(51) Int. Cl.
*H01L 45/00*    (2006.01)
*G11C 13/00*    (2006.01)
(Continued)

(52) U.S. Cl.
CPC .......... *H01L 45/145* (2013.01); *G11C 11/5685* (2013.01); *G11C 13/0007* (2013.01);
(Continued)

(58) Field of Classification Search
CPC ..... H01L 45/08; H01L 45/085; H01L 45/145; H01L 45/146; G11C 13/0002; G11C 13/0007
USPC .......................... 257/2–5, E45.003; 365/148
See application file for complete search history.

(56) References Cited

U.S. PATENT DOCUMENTS 6,473,332 B1    10/2002    Ignatiev et al.
7,417,271 B2    8/2008    Genrikh et al.
(Continued)

FOREIGN PATENT DOCUMENTS

JP    2007-235139    9/2007
JP    2007-235142    9/2007
(Continued)

OTHER PUBLICATIONS

International Search Report issued Nov. 27, 2012 in corresponding International Application No. PCT/JP2012/006734.
(Continued)

*Primary Examiner* — Allison P Bernstein
(74) *Attorney, Agent, or Firm* — Wenderoth, Lind & Ponack, L.L.P.

(57) ABSTRACT

A variable resistance nonvolatile memory element includes a first electrode, a second electrode, and a variable resistance layer including: a first oxide layer including a metal oxide having non-stoichiometric composition and including p-type carriers; a second oxide layer located between and in contact with the first oxide layer and a second electrode and including a metal oxide having non-stoichiometric composition and including n-type carriers; an oxygen reservoir region located in the first oxide layer, having no contact with the first electrode, and having an oxygen content atomic percentage higher than that of the first oxide layer; and a local region located in the second oxide layer, having contact with the oxygen reservoir region, and having an oxygen content atomic percentage lower than that of the second oxide layer.

14 Claims, 19 Drawing Sheets

(51) Int. Cl.
*G11C 11/56* (2006.01)
*H01L 27/10* (2006.01)
*H01L 27/24* (2006.01)

(52) U.S. Cl.
CPC .............. *H01L27/101* (2013.01); *H01L 45/08* (2013.01); *H01L 45/146* (2013.01); *H01L 45/1625* (2013.01); *G11C 13/004* (2013.01); *G11C 13/0069* (2013.01); *H01L 27/2463* (2013.01); *G11C 2013/0073* (2013.01); *G11C 2013/0083* (2013.01); *G11C 2213/15* (2013.01)
USPC ................ 257/3; 257/2; 257/4; 257/E45.003; 365/148

(56) References Cited

U.S. PATENT DOCUMENTS

| | | | |
|---|---|---|---|
| 7,668,002 B2 | 2/2010 | Kinoshita et al. | |
| 7,760,545 B2 | 7/2010 | Nakai | |
| 7,842,991 B2 | 11/2010 | Cho et al. | |
| 7,894,239 B2 | 2/2011 | Tamai et al. | |
| 7,943,926 B2 | 5/2011 | Lee et al. | |
| 7,960,775 B2 | 6/2011 | Courtade et al. | |
| 7,978,047 B2 | 7/2011 | Hosoi et al. | |
| 8,043,926 B2 | 10/2011 | Cho et al. | |
| 8,054,674 B2 | 11/2011 | Tamai et al. | |
| 8,279,657 B2 | 10/2012 | Takagi et al. | |
| 8,309,946 B2 | 11/2012 | Mitani et al. | |
| 8,325,508 B2 | 12/2012 | Kawai et al. | |
| 8,350,262 B2 | 1/2013 | Lee et al. | |
| 8,822,972 B2* | 9/2014 | Yasuhara et al. | 257/4 |
| 8,854,864 B2* | 10/2014 | Wei et al. | 365/148 |
| 2007/0200158 A1 | 8/2007 | Genrikh et al. | |
| 2007/0205456 A1 | 9/2007 | Lee et al. | |
| 2007/0267675 A1 | 11/2007 | Cho et al. | |
| 2007/0290186 A1 | 12/2007 | Bourim et al. | |
| 2008/0117664 A1 | 5/2008 | Kinoshita et al. | |
| 2008/0149912 A1 | 6/2008 | Nakai | |
| 2009/0147558 A1 | 6/2009 | Tamai et al. | |
| 2009/0152526 A1 | 6/2009 | Courtade et al. | |
| 2009/0231083 A1 | 9/2009 | Hosoi et al. | |
| 2010/0172170 A1 | 7/2010 | Tamai et al. | |
| 2011/0001109 A1 | 1/2011 | Ninomiya et al. | |
| 2011/0031465 A1 | 2/2011 | Mitani et al. | |
| 2011/0051500 A1 | 3/2011 | Takagi et al. | |
| 2011/0059576 A1 | 3/2011 | Cho et al. | |
| 2011/0095287 A1 | 4/2011 | Lee et al. | |
| 2011/0110144 A1 | 5/2011 | Kawai et al. | |
| 2012/0120712 A1 | 5/2012 | Kawai et al. | |
| 2012/0327702 A1 | 12/2012 | Takagi et al. | |
| 2014/0063909 A1* | 3/2014 | Muraoka et al. | 365/148 |
| 2014/0110659 A1* | 4/2014 | Murase et al. | 257/4 |
| 2014/0126268 A1* | 5/2014 | Katayama et al. | 365/148 |

FOREIGN PATENT DOCUMENTS

| | | |
|---|---|---|
| JP | 2007-300082 | 11/2007 |
| JP | 2007-311798 | 11/2007 |
| JP | 2008-181633 | 8/2008 |
| JP | 2008-306157 | 12/2008 |
| JP | 2009-141225 | 6/2009 |
| JP | 2009-164580 | 7/2009 |
| JP | 2010-135541 | 6/2010 |
| JP | 4592828 | 12/2010 |
| JP | 4705202 | 6/2011 |
| WO | 2006/075574 | 7/2006 |
| WO | 2007/013174 | 2/2007 |
| WO | 2007/026509 | 3/2007 |
| WO | 2008/142919 | 11/2008 |
| WO | 2010/064446 | 6/2010 |
| WO | 2010/073897 | 7/2010 |
| WO | 2010/086916 | 8/2010 |
| WO | 2010/143414 | 12/2010 |

OTHER PUBLICATIONS

Rainer Waser et al., "Redox-Based Resistive Switching Memories—Nanoionic Mechanisms, Prospects, and Challenges," Advanced Materials, vol. 21, No. 25-26, pp. 2632-2663, Jul. 2009.

Sheng-Chi Chen et al., "Preparation and properties of p-type semi-transparent conductive nickel oxide films", 2010 IEEE 3rd International Nanoelectronics Conference (INEC), Jan. 3-8, 2010, pp. 1094-1095.

Masayuki Terai et al., "Effect of ReRAM-Stack Asymmetry on Read Disturb Immunity", IEEE 47th Annual International Reliability Physics Symposium (IRPS), Apr. 26-30, 2009, pp. 134-138.

* cited by examiner

NONVOLATILE MEMORY ELEMENT AND NONVOLATILE MEMORY DEVICE

TECHNICAL FIELD

The present invention relates to nonvolatile memory elements, and particularly to a variable resistance nonvolatile memory element having resistance which reversibly changes according to an electrical signal applied thereto, and a nonvolatile memory device including the nonvolatile memory element.

BACKGROUND ART

In recent years, demand for high-capacity non volatile memory devices for storage of data of music, pictures, and other information has been increasing with progress of digital technology for electric appliances. A notable means to meet this demand is a resistance random access memory device (hereinafter referred to as a ReRAM). A ReRAM includes memory cells which are nonvolatile memory elements each having resistance changeable according to an electrical signal applied thereto and thereafter retained. This notability is due to characteristics of the nonvolatile memory element, such as its structure which is so simple that density can be easily increased, and which is compatible with conventional semiconductor processes.

Such nonvolatile memory elements are categorized into two major types according to materials for variable resistance layers (variable resistance material). A variable resistance nonvolatile memory element of one type includes a perovskite-based material disclosed in, for example, Patent Literature (PTL) 1, such as $Pr_{1-x}Ca_xMnO_3$ (PCMO), $La_{1-x}Sr_xMnO_3$ (LSMO), or $GdBaCo_xO_y$ (GBCO), as a variable resistance material.

A variable resistance nonvolatile memory element of the other type includes a binary transition metal oxide as a variable resistance material. Compared to the perovskite-based material, composition and structure of binary transition metal oxides are so simple that composition control and film formation in manufacturing can be easily performed. Furthermore, binary transition metal oxides advantageously have rather favorable compatibility with semiconductor processes, and thus there has been considerable research on binary transition metal oxides.

Although much about the mechanism of resistance change still remains unknown, recent researches have found that a likely cause of such resistance change is change in defect density of conductive filaments formed in a binary transition metal oxide by an oxidation-reduction reaction (for example, see PTL 2 and Non Patent Literature (NPL) 1).

FIG. 15 is a cross-sectional view showing a configuration of a conventional nonvolatile memory element 1400 disclosed in PTL 2.

The nonvolatile memory element 1400 initially has a structure in which a variable resistance layer 1405 including a transition metal oxide layer is located between a first electrode 1403 and a second electrode 1406 ((a) in FIG. 15). Then, a voltage (initial breakdown voltage) is applied between the first electrode 1403 and the second electrode 1406, so that a filament 1405c is formed which serves as a current path between the first electrode 1403 and the second electrode 1406 (that is, a portion where a current flowing between the first electrode 1403 and the second electrode 1406 locally has a higher density) ((b) in FIG. 15).

CITATION LIST

Patent Literature

[PTL 1]
Description of U.S. Pat. No. 6,473,332
[PTL 2]
Japanese Unexamined Patent Application Publication No. 2008-306157

Non Patent Literature

[NPL 1]
R. Maser et al, Advanced Materials, No. 21, 2009, pp. 2632-2663

SUMMARY OF INVENTION

Technical Problem

The conventional nonvolatile memory elements including the above-described transition metal oxide as a variable resistance material have been desired to have smaller variation in resistance change characteristics.

The present invention, conceived to address the problem, has an object of providing nonvolatile memory elements having smaller differences in resistance change characteristics and such nonvolatile memory devices.

Solution to Problem

In order to solve the problem with the conventional technique, provided is a nonvolatile memory element according to an aspect of the present invention which includes: a first electrode; a second electrode; and a variable resistance layer which is interposed between the first electrode and the second electrode and capable of reversibly switching between a high resistance state and a low resistance state based on a polarity of a voltage applied between the first electrode and the second electrode, wherein the variable resistance layer includes: a first oxide layer comprising a metal oxide having non-stoichiometric composition and including p-type carriers; a second oxide layer located between and in contact with the first oxide layer and the second electrode and comprising a metal oxide having non-stoichiometric composition and including n-type carriers; an oxygen reservoir region located in the first oxide layer, having no contact with the first electrode, and having an oxygen content atomic percentage higher than an oxygen content atomic percentage of the first oxide layer; and a local region located in the second oxide layer, having contact with the oxygen reservoir region, and having an oxygen content atomic percentage lower than an oxygen content atomic percentage of the second oxide layer.

Advantageous Effects of Invention

According to the present invention, resistance change is controlled in a local region so that nonvolatile memory elements have smaller variation in resistance change characteristics.

BRIEF DESCRIPTION OF DRAWINGS

FIG. 1 is a cross-sectional view showing an exemplary configuration of a nonvolatile memory element according to Embodiment 1 of the present invention.

[FIG. 2A]

FIG. 2A is a schematic view illustrating configuration of filaments which conduct electricity in a local region of a nonvolatile memory element according to Embodiment 1 of the present invention.

[FIG. 2B]

FIG. 2B is a schematic view illustrating configuration of filaments which conduct electricity in a local region of the nonvolatile memory element according to Embodiment 1 of the present invention.

[FIG. 2C]

FIG. 2C is a schematic view illustrating a configuration of filaments which conduct electricity in a local region of the nonvolatile memory element according to Embodiment 1 of the present invention.

FIG. 3 shows a relationship between oxygen content atomic percentages and resistivity in a second oxide layer of the nonvolatile memory element according to Embodiment 1 of the present invention.

FIG. 4A is a cross-sectional view illustrating a process of forming a principal part of a nonvolatile memory element according to Embodiment 1 of the present invention.

FIG. 4B is a cross-sectional view illustrating a process of forming the principal part of the nonvolatile memory element according to Embodiment 1 of the present invention.

FIG. 4C is a cross-sectional view illustrating a process of forming the principal part of the nonvolatile memory element according to Embodiment 1 of the present invention.

FIG. 4D is a cross-sectional view illustrating a process of forming the principal part of the nonvolatile memory element according to Embodiment 1 of the present invention.

FIG. 5 shows exemplary operation of the nonvolatile memory element according to Embodiment 1 of the present invention.

FIG. 6 is a block diagram showing a configuration of a nonvolatile memory device according to Embodiment 2 of the present invention.

FIG. 7 is a perspective view illustrating a configuration of an A part (configuration for four bits) in FIG. 6.

FIG. 8 is a cross-sectional view illustrating a configuration of a nonvolatile memory element included in the nonvolatile memory device according to Embodiment 2 of the present invention.

FIG. 9 is a timing diagram showing exemplary operation of the nonvolatile memory device according to Embodiment 2 of the present invention.

FIG. 10 is a block diagram showing a configuration of a nonvolatile memory device according to Embodiment 3 of the present invention.

FIG. 11 is a cross-sectional view illustrating a configuration of a C part (configuration for two bits) in FIG. 10.

FIG. 12 is a timing diagram showing exemplary operation of the nonvolatile memory device according to Embodiment 3 of the present invention.

FIG. 13 is a graph showing a relationship between resistance of a nonvolatile memory element including $TaO_y/TaO_x$, and voltage of voltage pulses applied thereto.

FIG. 14A is a TEM image of a cross-section of a nonvolatile memory element including $TaO_y/TaO_x$.

FIG. 14B is an enlarged TEM image of a cross-section showing a part (A part in FIG. 14A) of the nonvolatile memory element including $TaO_y/TaO_x$.

FIG. 15 is a cross-sectional view of a conventional nonvolatile memory element.

DESCRIPTION OF EMBODIMENTS

Before describing the present invention, discussed are results of experiments conducted by the inventors and causes of variation in resistance change characteristics observed in the experiments. This will be discussed with reference to FIG. 13, FIG. 14A, and FIG. 14B, which help the embodiments described below be understood. The present invention is not limited to these drawings and the discussion.

Figure 13:
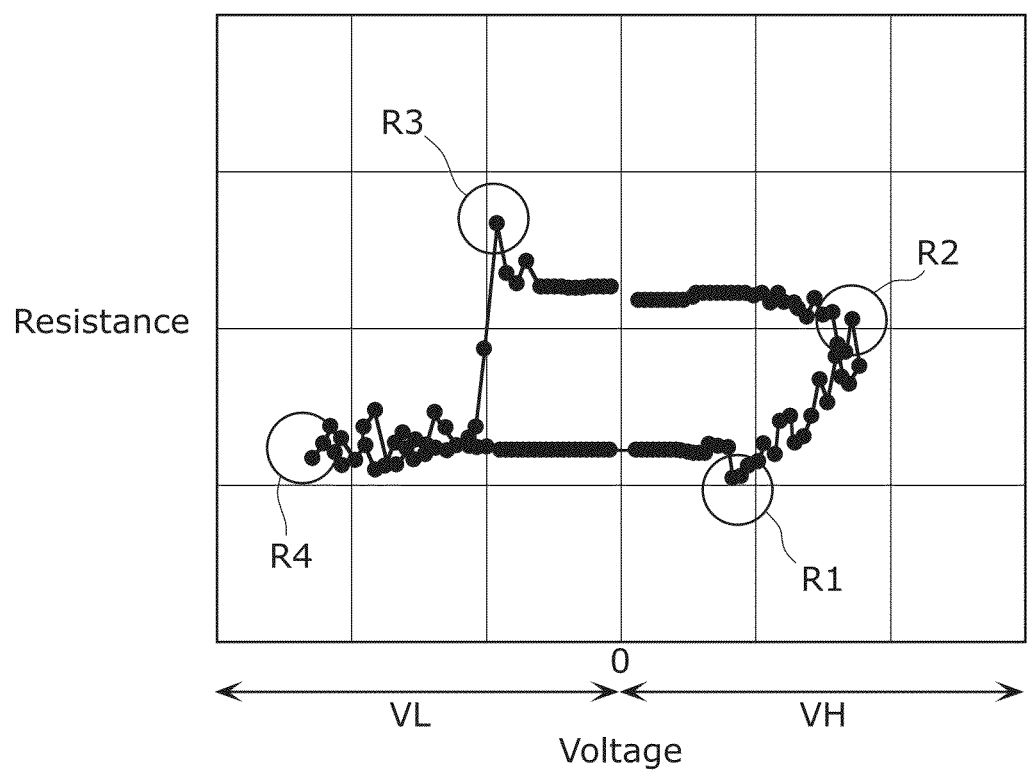
[FIG. 13]

FIG. 13 is a graph showing a relationship between resistance of a variable resistance element and voltage applied thereto after repetition (for example, 100,000 times) of applications of voltage pulses between electrodes of a nonvolatile memory element including $TaO_y/TaO_x$ as variable resistance materials. The voltage pulses are pulses of a voltage VH and a voltage VL which have different polarities. The voltage VH is a high resistance writing voltage and the voltage VL is a low resistance writing voltage. The high resistance writing voltage has an absolute value higher than the absolute value of a threshold voltage for high resistance writing, and the low resistance writing voltage has an absolute value higher than the absolute value of a threshold voltage for low resistance writing.

Figure 14A:
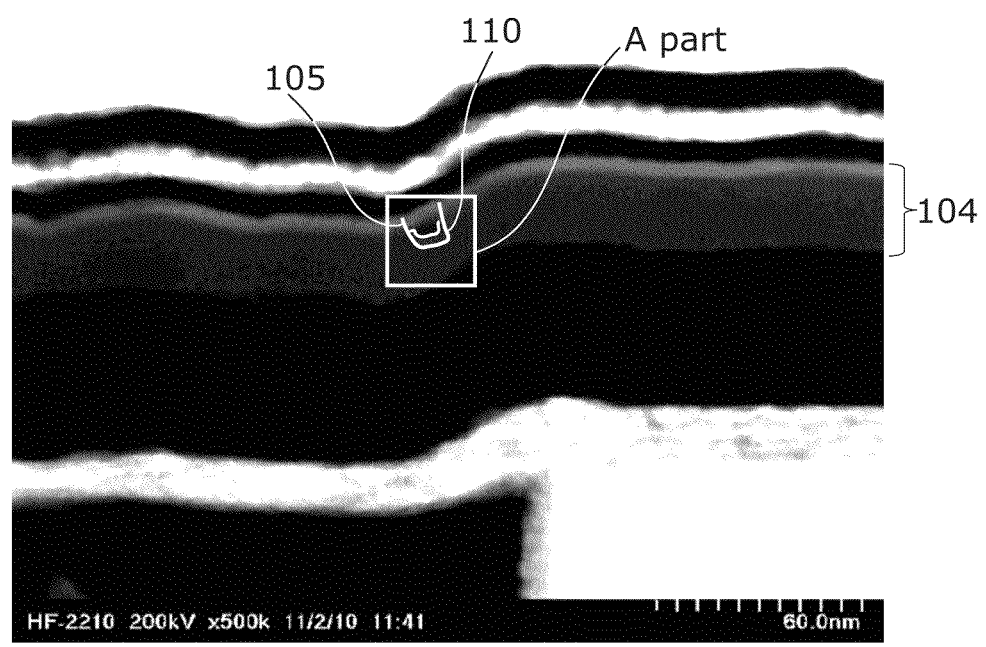
[FIG. 14A]
Figure 14B:
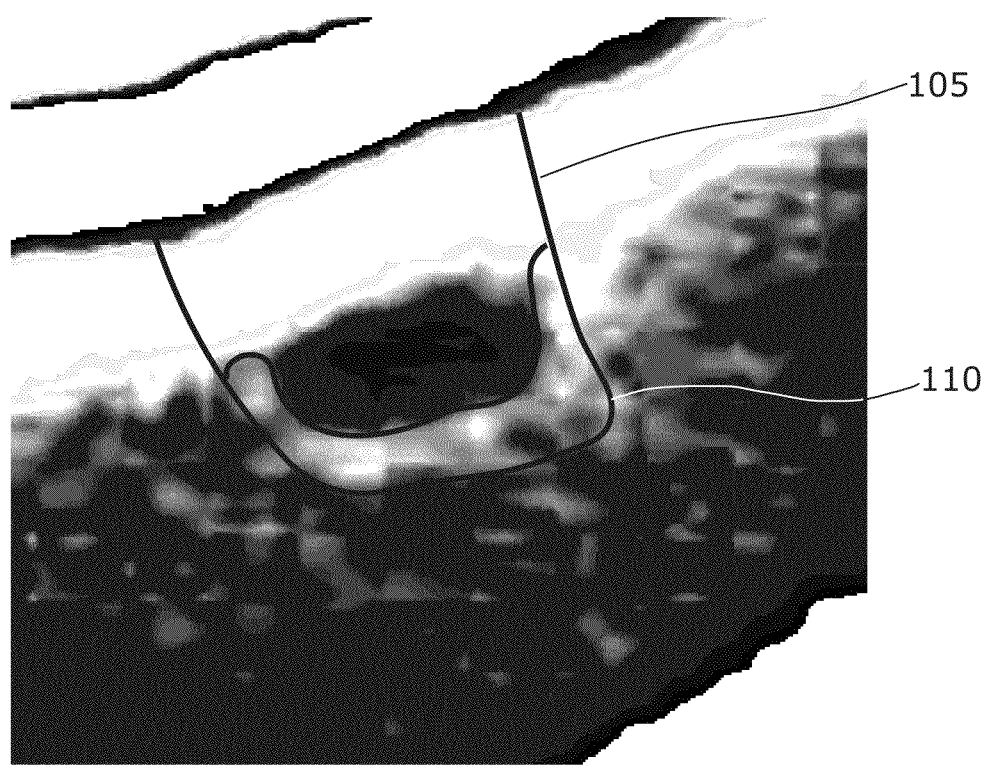
[FIG. 14B]
Figure 15:
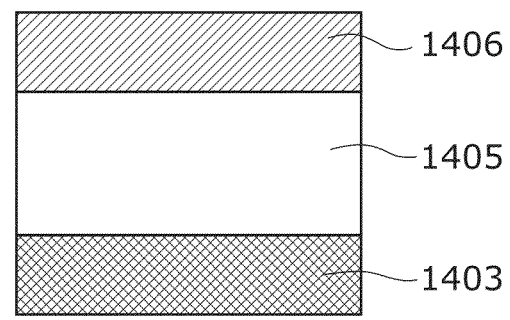
[FIG. 15]
Figure 15:
Figure 15:
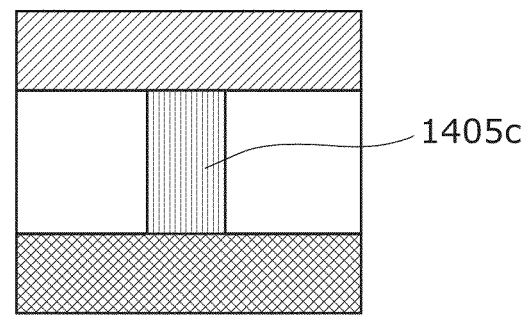

As shown in FIG. 13, resistance R1 and resistance R4 in a low resistance state each show variation, and resistance R2 and resistance R3 in a high resistance state each show variation. The cause for the variation is discussed as follows based on observation of a cross-section of a local region 105 in transmission electron microscope (TEM) image shown in FIG. 14A and FIG. 14B. The local region 105 is a region in which resistance change of a nonvolatile memory element occurs. FIG. 14A is a TEM image of a cross-section of the nonvolatile memory element which is the object of the measurement shown in FIG. 13, FIG. 14B is an enlarged TEM image of a part of the cross-section shown in FIG. 14A (A part in FIG. 14A). In the TEM images, the lighter regions indicate regions having more oxygen, and darker regions indicate regions having less oxygen. In other words, the lighter regions and the darker regions indicate regions where resistance is relatively high and regions where resistance is relatively low in the variable resistance layer 104, respectively.

FIG. 14A and FIG. 14B show a local region 105 and an oxygen reservoir region 110. FIG. 14A and FIG. 14B also show that the oxygen reservoir region 110 and an upper part of the local region 105 are high-oxygen regions, and the region between the oxygen reservoir region 110 and an upper part of the local region 105 is a low-oxygen region. Tantalum oxide having a higher oxygen content atomic percentage has a higher resistance. Thus, the nonvolatile memory element includes two higher-resistance portions of the local region 105 and the oxygen reservoir region 110. The two different portions rule the resistance value in change in resistance of the nonvolatile memory element, which causes a wider variation in resistance change characteristics. The variation may be due to the high-oxygen region which is the oxygen reservoir region 110 producing a parasitic resistance effect.

The present invention solves the problem to reduce variation in resistance change characteristics.

A nonvolatile memory element according to an aspect of the present invention includes: a first electrode; a second electrode; and a variable resistance layer which is interposed between the first electrode and the second electrode and capable of reversibly switching between a high resistance state and a low resistance state based on a polarity of a voltage applied between the first electrode and the second electrode, wherein the variable resistance layer includes: a first oxide layer comprising a metal oxide having non-stoichiometric composition and including p-type carriers; a second oxide layer located between and in contact with the first oxide layer and the second electrode and comprising a metal oxide having non-stoichiometric composition and including n-type carriers; an oxygen reservoir region located in the first oxide layer, having no contact with the first electrode, and having an oxygen content atomic percentage higher than an oxygen content atomic percentage of the first oxide layer; and a local region located in the second oxide layer, having contact with the oxygen reservoir region, and having an oxygen content atomic percentage lower than an oxygen content atomic percentage of the second oxide layer.

In this configuration, the oxygen reservoir region below the local region includes a metal oxide having non-stoichiometric composition and including p-type carriers, and thus has a lower resistance when the oxygen content atomic percentage of the oxygen reservoir region is higher. As a result, there is no parasitic resistance due to the oxygen reservoir region and the local region dominates the resistance change characteristics, so that variation in resistance change characteristics is reduced.

Embodiments of the present invention shall be described below with reference to the drawings.

It should be noted that elements having substantially the same configurations, functions, and effects are denoted with the same reference signs in the drawings, and thus detailed description thereof is omitted. It should be also noted that numerical values, materials, methods of forming films, and others described below are all given for illustrative purposes to concretely describe embodiments of the present invention and are not intended to limit the present invention, it should be also noted that the connections between constituent elements described below are all given for illustrative purposes to concretely describe embodiments of the present invention and are not intended to limit connections to provide the features of the present invention. The scope of the present invention is limited only by the claims. Thus, among the constituent elements in the following embodiments, a constituent element not included in the independent claim providing the highest level description of the present invention is not always necessary for the present invention to solve the problem but shall be described as a constituent element of a preferable embodiment.

[Configuration of Nonvolatile Memory Element]

Figure 1:
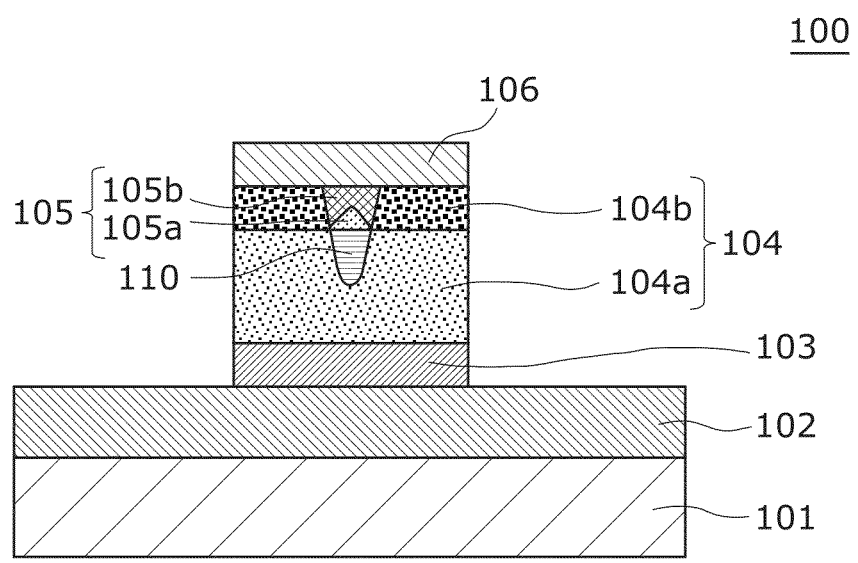
[FIG. 1]

FIG. 1 is a cross-sectional view showing an exemplary configuration of a nonvolatile memory element according to Embodiment 1 of the present invention.

A nonvolatile memory element (here, a variable resistance element) 100 in Embodiment 1 includes a substrate 101, an interlayer insulating film 102 formed on the substrate 101, and a first electrode 103, a second electrode 106, and a variable resistance layer 104 formed above the interlayer insulating film 102. The variable resistance layer 104 is located between the first electrode 103 and the second electrode 106.

The variable resistance layer 104 is interposed between the first electrode 103 and the second electrode 106 and has resistance which reversibly changes according to an electrical signal provided between the first electrode 103 and the second electrode 106. For example, the variable resistance layer 104 reversibly switches between a high resistance state and a low resistance state according to the polarity of a voltage applied between the first electrode 103 and the second electrode 106.

The variable resistance layer 104 has a layered structure of at least the following two layers: a first oxide layer 104a including a first metal oxide having non-stoichiometric composition and including p-type carriers; and a second metal oxide having non-stoichiometric composition and including n-type carriers. The first oxide layer 104a is connected to a first electrode 103. The second oxide layer 104b is connected to a second electrode 106. The metal oxide having non-stoichiometric composition and including p-type carriers is a metal-deficient oxide or an oxygen-excessive oxide. The metal oxide having non-stoichiometric composition and including n-type carriers is an oxygen-deficient oxide or a metal-excessive oxide.

The variable resistance layer 104 includes a metal oxide. The metal in the metal oxide may be at least one of aluminum (Al) or a transition metal such as tantalum (Ta), hafnium (Hf), titanium (Ti), zirconium (Zr), niobium (Nb), tungsten (W), nickel (Ni), or iron (Fe). With property that the transition metals can be in more than one oxidation states, different resistance states can be obtained in oxidation-reduction reaction.

The metal-deficient oxide is an oxide deficient in metal ions with respect to stoichiometric composition and includes p-type carriers corresponding to metal vacancies, for example. The oxygen-excessive oxide is an oxide having excessive oxygen ions with respect to stoichiometric composition and includes p-type carriers corresponding to interstitial oxygen ions, for example. The oxygen-deficient oxide is an oxide deficient in oxygen ions with respect to stoichiometric composition and includes n-type carriers corresponding to oxygen vacancies, for example. The metal-excessive oxide is an oxide having excessive metal ions with respect to stoichiometric composition and includes n-type carriers corresponding to interstitial metal ions, for example.

The first oxide layer 104a has a resistance value lower than the resistance of the second oxide layer 104b. In this configuration, voltage applied between the first electrode 103 and the second electrode 106 to change resistance is distributed more to the second metal oxide than to the first metal oxide, so that oxidation-reduction reactions are likely to occur more in the second metal oxide.

When the first oxide layer 104a is a metal-deficient oxide and the second oxide layer 104b is a metal-excessive oxide, the first oxide layer 104a has a degree of metal deficiency higher than the degree of metal excess of the second oxide layer 104b. It should be noted that the "degree of metal deficiency" refers to a rate of deficiency in metal of a metal oxide to stoichiometric composition of the metal oxide (or to stoichiometric composition which provides the metal oxide with the highest resistance value when a plurality of stoichiometric ratios is applicable to the metal oxide). A metal oxide having stoichiometric composition is more stable and has a resistance value higher than the resistance value of the metal oxide having non-stoichiometric composition. It should be noted that the "degree of metal excess" refers to a rate of excessive metal of a metal oxide to stoichiometric composition of the metal oxide.

When the first oxide layer 104a is an oxygen-excessive oxide and the second oxide layer 104b is an oxygen-deficient oxide, the first oxide layer 104a has a degree of oxygen excess higher than the degree of oxygen deficiency of the second oxide layer 104b. It should be noted that the "degree of oxygen excess" refers to a rate of excessive oxygen of a metal oxide to stoichiometric composition of the metal oxide. It should be also noted that the "degree of oxygen deficiency" of a metal oxide refers to a rate of deficiency in oxygen to stoichiometric composition of the metal oxide. An oxide having a lower degree of oxygen deficiency is similar to the oxide having stoichiometric composition and therefore has a higher resistance value, and an oxide having a higher degree of oxygen deficiency is similar to the metal included in the oxide and therefore has a lower resistance value.

For example, in the case of tantalum (Ta), which is a metal, the oxide having stoichiometric composition according to the above definition is $Ta_2O_5$, and this can be also expressed as $TaO_{2.5}$. The degree of oxygen deficiency of $TaO_{2.5}$ is 0%. The degree of oxygen deficiency of $TaO_{1.5}$ is $(2.5-1.5)/2.5$, that is, 40%.

When the first oxide layer 104a is a metal-deficient oxide and the second oxide layer 104b is an oxygen-deficient oxide, the first oxide layer 104a has a degree of metal deficiency higher than the degree of oxygen deficiency of the second oxide layer 104b.

When the first oxide layer 104a is an oxygen-excessive oxide and the second oxide layer 104b is a metal-excessive oxide, the first oxide layer 104a has a degree of oxygen excess higher than the degree of metal excess of the second oxide layer 104b.

In the present Description, the ratio of the number of oxygen atoms to the total number of atoms may be referred to as an "oxygen content atomic percentage", which is used instead of the degree of oxygen deficiency or the degree of oxygen excess. For example, when an oxide is an oxygen-deficient oxide, the oxide has an oxygen content atomic percentage lower than the oxygen content atomic percentage of the oxide having stoichiometric composition. When an oxide is an oxygen-excessive oxide, the oxide has an oxygen content atomic percentage higher than the oxygen content atomic percentage of the oxide having stoichiometric composition. Generally, an oxygen-deficient oxide or a metal-excessive oxide having a higher oxygen content atomic percentage has a higher resistance value. On the other hand, a metal-deficient oxide or an oxygen-excessive oxide having a higher oxygen content atomic percentage has a lower resistance value.

The "oxygen content atomic percentage" is the ratio of the number of oxygen atoms to the total number of atoms. For example, the oxygen content atomic percentage of $Ta_2O_5$ is the ratio of the number of oxygen atoms to the total number of atoms (O/(Ta+O)), that is, 71.4 atm %. Accordingly, oxygen-deficient tantalum oxide has an oxygen content atomic percentage higher than 0 atm % and lower than 71.4 atm %.

The metal oxide included in the second oxide layer 104b and the metal oxide included in the first oxide layer 104a may be oxides of different metals. In other words, the first metal included in the first metal oxide, which is a material for the first oxide layer 104a, and the second metal included in the second metal oxide, which is a material for the second oxide layer 104b, may be different metals.

The variable resistance layer 104 includes the oxygen reservoir region 110 and the local region 105. The oxygen reservoir region 110 is located in the first oxide layer 104a and has no contact with the first electrode 103. The local region 105 is located in the second oxide layer 104b and has contact with the second electrode 106 and the oxygen reservoir region 110. The local region 105 has an oxygen content atomic percentage lower than the oxygen content atomic percentage of the second oxide layer 104b. At least part of the local region 105 is formed in the second oxide layer 104b. The oxygen content atomic percentage of the local region 105 reversibly changes upon application of an electrical pulse. It is conceivable that the local region 105 includes a filament composed of oxygen defect sites or metal excess sites.

It is also conceivable that change in resistance of the variable resistance layer 104 having a layered structure is change in the resistance of the local region 105 caused by change in the filament (conduction path) in the local region 105 due to an oxidation-reduction reaction inside the local region 105, which is a very small region.

For example, when the local region 105 includes a filament composed of oxygen defect sites, and a positive voltage is applied to the second electrode 106 with respect to the first electrode 103, oxygen ions in the variable resistance layer 104 are attracted toward a second metal oxide. This causes an oxidation reaction in the small local region 105, and thereby the oxygen content atomic percentage is lowered. As a result, the filament inside the local region 105 becomes less conductive and the resistance value of the local region 105 increases. In contrast, when a negative voltage is applied to the second electrode 106 with respect to the first electrode 103, oxygen ions in the second oxide layer 104b are driven toward the first oxide layer 104a. This causes a reduction reaction in the small local region 105 formed in the second oxide layer 104b, and thereby the oxygen content atomic percentage is increased. As a result, the filament inside the local region 105 becomes more conductive and the resistance value of the local region 105 decreases.

The first oxide layer 104a is located between the first electrode 103 and the second oxide layer 104b. The second oxide layer 104b is located between and in contact with the first oxide layer 104a and the second electrode 106. The second oxide layer 104b may be less thick than the first oxide layer 104a. In this case, an electric field is likely to localize in the second oxide layer 104b, enabling lowering of an initial breakdown voltage to be applied to form the local region 105 which determines the resistance value in change in resistance.

The local region 105 and the oxygen reservoir region 110 are formed by applying an initial breakdown voltage to the variable resistance layer 104 having a layered structure of the first oxide layer 104a and the second oxide layer 104b. The initial breakdown voltage may be a low voltage as will be described later in the present Description. As a result of initial breakdown, the local region 105 and the oxygen reservoir region 110 are formed. The local region 105 has an upper end having contact with the second electrode 106 and a lower end having no contact with the first electrode 103, penetrating the second oxide layer oxide 104b. The oxygen reservoir region 110 has an upper end having contact with the lower end of the local region 105 and a lower end having no contact with the first electrode 103. The local region 105 and the oxygen reservoir region 110 are located in the vicinity of the interface between the first oxide layer 104a and the second oxide layer 104b.

In the present Description, the local region refers to a part of the variable resistance layer 104 in which a current dominantly flows when a voltage is applied between the first electrode 103 and the second electrode 106. The local region 105 also means a region including a group of filaments (conduction paths) formed in the variable resistance layer 104. In other words, change in the resistance of the variable resistance layer 104 occurs in the local region 105. Thus, when a driving voltage is applied to the variable resistance layer 104 in the low resistance state, a current dominantly flows in the local region 105 including the filaments. Changing between the high resistance state and the low resistance state occurs in the local region 105 of the variable resistance layer 104.

Figures 2A, 2B, 2C:
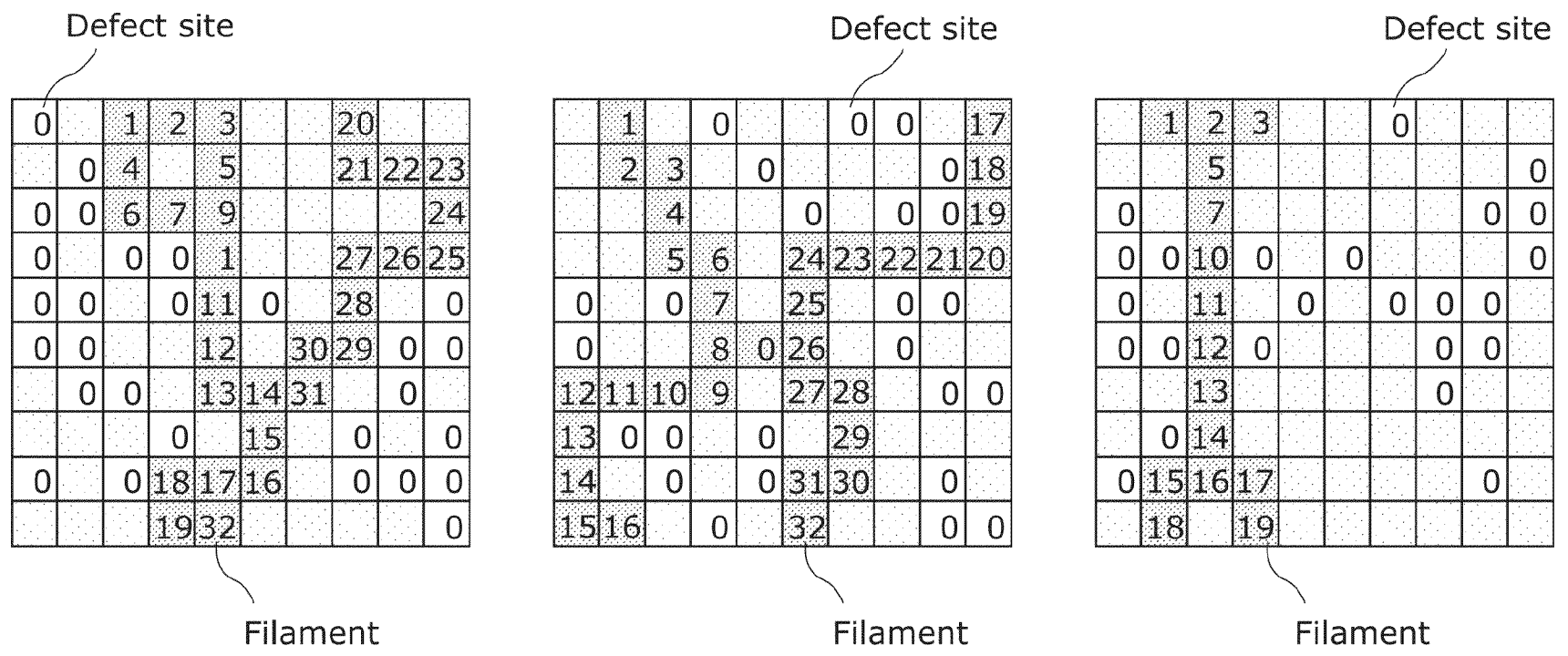

FIG. 2A to FIG. 2C illustrate formation of a filament in the local region 105 by showing a result of simulation using a percolation model. It is assumed here that oxygen-defect sites in the local region 105 connect to each other to form a filament (conduction path). The percolation model is based on a theory that when oxygen-defect sites (hereinafter simply referred to as defect sites) are randomly distributed in the local region 105 and the density of the defect sites exceeds a threshold, a connection between the defect sites is formed with an increased probability. The term "defect" means lack of oxygen in a metal oxide, and the term "density of defect sites" corresponds to the degree of oxygen deficiency. More specifically, the higher the degree of oxygen deficiency is, the higher the density of defect sites is.

In this model, approximate sites of oxygen ions in the variable resistance layer 104 are assumed as sections (hereinafter referred to as sites) in a lattice, and filaments formed by connections of stochastically-formed defect sites are simulated. The sites labeled as "0" in FIG. 2A to FIG. 2C represent defect sites formed in the local region 105. The cluster (aggregation of mutually connected defect sites) of the thickly dotted sites (the sites labeled as any number other than "0") represents filaments or a current path formed in the local region 105 by applying a voltage in the top-bottom direction of each diagram. The thinly-dotted sites (the sites with no numerical label) represent sites occupied by oxygen ions and having a high resistance. As shown in FIG. 2A to FIG. 2C, the defect sites are randomly distributed in the local region 105 and the cluster of defect sites connected from the top to the bottom includes a group of filaments, which allows a current to flow between the upper surface and the lower surface of the local region 105. The number and the shape of the filaments are stochastically determined based on the percolation model. Distributions of the number and the shape of the filaments correspond to distribution of resistance values in the variable resistance layer 104.

The local region 105 includes a first local region 105a and a second local region 105b. The first local region 105a is located away from the second electrode 106 in the local region 105 and has an oxygen content atomic percentage lower than the oxygen content atomic percentage of the second oxide layer 104b. The second local region 105b is located closer to the second electrode 106 in the local region 105 and has an oxygen content atomic percentage higher than the oxygen content atomic percentage of the first local region 105a and lower than the oxygen content atomic percentage of the second oxide layer 104b. The local region 105, that is, the set of the first local region 105a and the second local region 105b formed in the variable resistance layer may be a single set of local region in the variable resistance layer.

The oxygen reservoir region 110 is formed on the first oxide layer 104a so as to have no contact with the first electrode 103. The oxygen reservoir region 110 is a single oxygen reservoir region in the variable resistance layer 104.

The first local region 105a is formed in the second oxide layer 104b between the second local region 105b and the oxygen reservoir region 110 (the first oxide layer 104a) so as to have contact with the oxygen reservoir region 110. The second local region 105b is formed in the second oxide layer 104b between the second electrode 106 and the first local region 105a so as to have contact with the second electrode 106 and the first local region 105a.

The local region 105 may be small in size. The oxygen reservoir region 110 has a size such that the lower end of the oxygen reservoir region 110 has no contact with the first electrode 103. The diameter of the second local region 105b varies depending on the size of the nonvolatile memory element and may be small. Reduction of the local region 105, especially the second local region 105b, in size reduces variation in resistance change. However, the second local region 105b is large enough at least to securely include filaments (conduction paths) to allow a current to flow.

Oxygen in the second oxide layer 104b is locally moved to the first oxide layer 104a as a result of initial breakdown, so that the local region 105 is formed. The local region 105 and the variable resistance layer 104 except the local region 105 are in parallel, and the resistance of the nonvolatile memory element 100 is determined by the local region 105.

To drive the nonvolatile memory element 100, a voltage satisfying a predetermined condition is applied between the first electrode 103 and the second electrode 106 from an external power supply. The resistance of the variable resistance layer 104 of the nonvolatile memory element 100 reversibly increases or decreases according to the value and polarity of the applied voltage. For example, when the applied pulse voltage has a predetermined polarity and an amplitude larger than the amplitude of a predetermined threshold voltage (threshold voltage for high resistance writing or threshold voltage for low resistance writing), the resistance of the variable resistance layer 104 increases or decreases. Such voltage may be hereinafter referred to as "write voltage". In contrast, when the applied pulse voltage has an amplitude smaller than the amplitude of the threshold voltages, the resistance of the variable resistance layer 104 remains the same. Such voltage may be hereinafter referred to as "read voltage".

The first oxide layer 104a includes a metal-deficient oxide or an oxygen-excessive oxide. The metal-deficient oxide is deficient in metal ions with respect to stoichiometric composition. The oxygen-excessive oxide has excessive oxygen ions with respect to stoichiometric composition. In other words, the oxygen-excessive oxide is a metal oxide having non-stoichiometric composition and including p-type carriers corresponding to metal vacancies or interstitial oxygen ions (hereinafter the oxygen-excessive oxide is also referred to as a p-type metal oxide having non-stoichiometric composition). For example, the first oxide layer 104a includes a p-type metal oxide having non-stoichiometric composition, and the metal oxide is an oxide of nickel. A p-type metal oxide having non-stoichiometric composition having a higher oxygen content atomic percentage has a lower resistivity. Taking nickel (Ni) as an exemplary metal included in the variable resistance layer 104, nickel oxide included in first oxide layer 104a may have a resistivity of 10 mΩ·cm, where the nickel oxide is expressed as $Ni_{1-x}O$. A correlation between resistivity of p-type nickel oxide and oxygen partial pressure for film formation is illustrated in FIG. 1 on pages 1049 to 1095 of S. Chen, et al., Nanoelectronics Conference (INEC), 2010 3rd International. Referring to FIG. 1, the higher the oxygen content atomic percentage is, the lower the resistivity of the nickel oxide is. When oxygen partial pressure is 95% or higher, resistivity is lower and less dependent on the oxygen partial pressure.

The second oxide layer 104b includes an oxygen-deficient oxide or a metal-excessive oxide. The oxygen-deficient oxide is deficient in metal ions with respect to stoichiometric composition. The metal-excessive oxide has excessive metal ions with respect to stoichiometric composition. In other words, the metal-excessive oxide is a metal oxide having non-stoichiometric composition and including n-type carriers corresponding to oxygen vacancies or interstitial metal ions (hereinafter the metal-excessive oxide is also referred to as an n-type metal oxide having non-stoichiometric composition). For example, the second oxide layer 104b includes an n-type metal oxide having non-stoichiometric composition, and the metal is tantalum. An n-type metal oxide having non-stoichiometric composition having a higher oxygen content atomic percentage has a higher resistivity. Taking tantalum (Ta) as an exemplary metal included in the second oxide layer 104b, a condition of 2.1≤y may be satisfied where tantalum oxide included in the second oxide layer 104b is represented as $TaO_y$.

The second local region 105b has an oxygen content atomic percentage higher than the oxygen content atomic percentage of the first local region 105a. The second oxide layer 104b includes an n-type metal oxide having non-stoichiometric composition. According to a correlation between resistivity and oxygen content atomic percentage of the n-type metal oxide having non-stoichiometric composition, the second local region 105b has the highest resistivity in the local region 105 and thus dominates the resistance of the nonvolatile memory element 100.

On the other hand, the oxygen reservoir region 110 has an oxygen content atomic percentage higher than the oxygen content atomic percentage of the first oxide layer 104a, and the first oxide layer 104a includes a p-type metal oxide having non-stoichiometric composition. In this case, according to a correlation between resistivity and oxygen content atomic percentage of the p-type metal oxide having non-stoichiometric composition, the resistivity of the oxygen reservoir region 110 is lower than or scarcely different from the resistivity of the first oxide layer 104a. As a result, the oxygen reservoir region 110 including the p-type metal oxide having non-stoichiometric composition avoids producing a parasitic resistance effect while having a high oxygen content atomic percentage, so that variation in resistance change characteristics are reduced.

Figure 3:
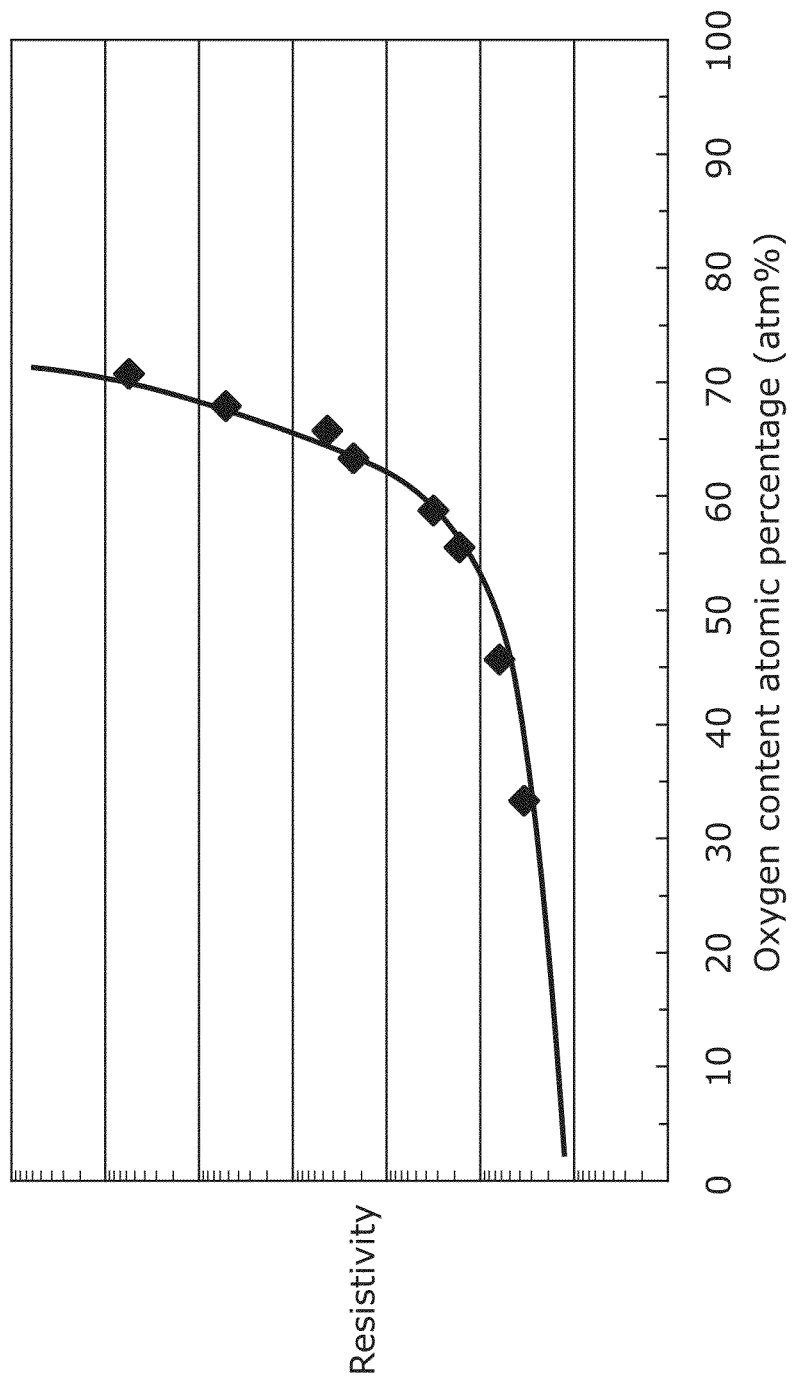
[FIG. 3]

FIG. 3 illustrates a relationship between oxygen content atomic percentages and resistivity of $TaO_y$. The resistivity is calculated based on sheet resistance obtained by measuring a sample using a 4-point probes method. The sample is a layer of only $TaO_y$ directly formed as the second oxide layer 104b on a substrate (in this measurement, a silicon wafer with a nitride film).

As illustrated in FIG. 3, the resistivity of $TaO_y$ increases as the oxygen content atomic percentage increases. For example, when the second oxide layer 104b has an oxygen content atomic percentage of 67.7% or higher, the resistivity of $TaO_y$ is 515 mΩ·cm or higher. The second oxide layer 104b thus dominates the resistance of a layered structure of the first oxide layer 104a and the second oxide layer 104b.

The first oxide layer 104a includes a p-type metal oxide having non-stoichiometric composition. Thus, unlike a metal oxide having stoichiometric composition, the resistivity of the oxygen reservoir region 110 does not increase in the first oxide layer 104a due to movement of oxygen ions. Accordingly, oxygen in the second oxide layer 104b does not driven to the lower end of the local region 105 by initial breakdown, and thus the local region 105 is formed to have not a structure illustrated in FIG. 14A or FIG. 14B but a structure illustrated in FIG. 1.

Whether a metal oxide having non-stoichiometric composition is a p-type metal oxide or an n-type metal oxide can be identified by measuring the level of a valence band and a Fermi level using X-ray photoelectron spectroscopy (XPS). Note that the definitions of the above-described oxygen-deficient oxide, metal-excessive oxide, oxygen-excessive oxide, and metal-deficient oxide are based on "Kinzoku Sankabutsu No Non-stoichiometry To Denki Dendo", pages 92 to 94, written by Yasutoshi Saito et al., Uchida Rokakuho. A metal oxide is identified as one of the oxygen-deficient oxide, metal-excessive oxide, oxygen-excessive oxide, and metal-deficient oxide by composition analysis.

Examples of materials for the first electrode 103 and the second electrode 106 include platinum (Pt), iridium (Ir), palladium (Pd), silver (Ag), nickel (Ni), tungsten (W), copper (Cu), aluminum (Al), tantalum (Ta), titanium (Ti), titanium nitride (TiN), tantalum nitride (TaN), and titanium nitride aluminum (TiAlN). The first electrode 103 and the second electrode 106 may be made of the same material. In this case, processing can be simplified by applying process conditions for the first electrode 103 also to the second electrode 106. Since the local region 105, which dominates resistance change, has no contact with the first electrode 103, the first electrode 103 made of the same material as the second electrode 106 does not affect resistance change of the first electrode 103.

More specifically, a material for the second electrode 106 connected to the second metal oxide having a lower degree of oxygen deficiency (or a higher oxygen content atomic percentage) may be platinum (Pt), iridium (Ir), or palladium (Pd), which has a high standard electrode potential compared to the metal included in the second metal oxide and the material for the first electrode 103. On the other hand, a material for the first electrode 103 connected to the first metal oxide having a higher degree of oxygen deficiency (or a lower oxygen content atomic percentage) may be tungsten (W), nickel (Ni), tantalum (Ta), titanium (Ti), aluminum (Al), tantalum nitride (TaN), or titanium nitride (TiN), which has a low standard electrode potential compared to the metal included in the first metal oxide. The higher the standard electrode potential of a material is, the more difficult to oxidize the material is.

More specifically, there may be a relation that $V_{r2}<V_2$ and a relation that $V_1<V_2$ among the standard electrode potential $V_2$ of the second electrode 106, the standard electrode potential $V_{r2}$ of the metal included in the second metal oxide, the standard electrode potential $Vr_1$ of the metal included in the first metal oxide, and the standard electrode potential $V_1$ of the first electrode 103. In addition, there may be a relation that $V_2>V_{r2}$ and a relation that $V_{r1}≥V_1$ thereamong.

In the above configuration, the second metal oxide near the interface between the second electrode 106 and the second metal oxide is selectively subjected to an oxidation-reduction reaction, and thereby stable resistance change is achieved.

The substrate 101 is not limited to but may be a single-crystal silicon substrate or a semiconductor substrate. The variable resistance layer 104 can be formed on a substrate at a relatively low temperature. Thus, the variable resistance layer 104 may be formed on a resin material.

The nonvolatile memory element 100 may further include a load element, such as a fixed resistor, a transistor, or a diode, electrically connected to the variable resistance layer 104.

[Operation of Nonvolatile Memory Element and Method of Manufacturing the Same]

An exemplary method of forming the nonvolatile memory element 100 according to Embodiment 1 will be described below with reference to FIG. 4A to FIG. 4D.

Figure 4A:
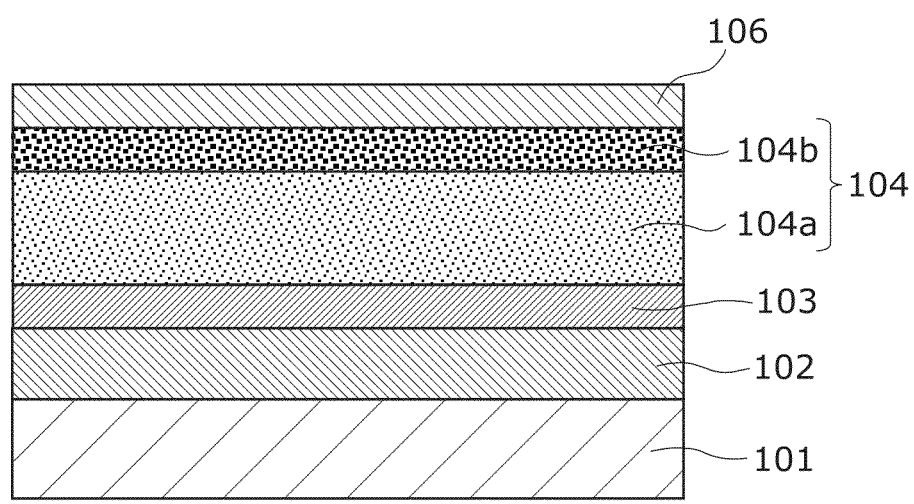
[FIG. 4A]

First, the interlayer insulating film 102 having a thickness of 200 nm is formed on the substrate 101 which is, for example, a single-crystal silicon substrate by thermal oxidation as shown in FIG. 4A. Next, the first electrode 103 is formed on the interlayer insulating film 102 by sputtering.

The first electrode 103 is, for example, a Pt thin film having a thickness of 100 nm. Optionally, an adhesive layer of Ti or TiN may be formed between the first electrode 103 and the interlayer insulating film 102 by sputtering. Next, the first oxide layer 104a is formed on the first electrode 103 by reactive sputtering using, for example, Ni as a sputtering target.

Next, the second oxide layer 104b is formed on the surface of the first oxide layer 104a by reactive sputtering using, for example, Ta as a sputtering target. The material for the second oxide layer 104b has a higher resistivity than the resistivity of the material for the first oxide layer 104a. The first oxide layer 104a and the second oxide layer 104b are stacked in layers so that the variable resistance layer 104 has a layered structure.

The second oxide layer 104b may have a thickness from approximately 1 nm to 8 nm. This is because the second oxide layer 104 has too high an initial resistance when having an excessively large thickness, and has unstable resistance change when having an excessively small thickness.

Next, the second electrode 106 is formed on the second oxide layer 104b by sputtering. The second electrode 106 is, for example, a Pt thin film having a thickness of 150 nm.

Figure 4B:
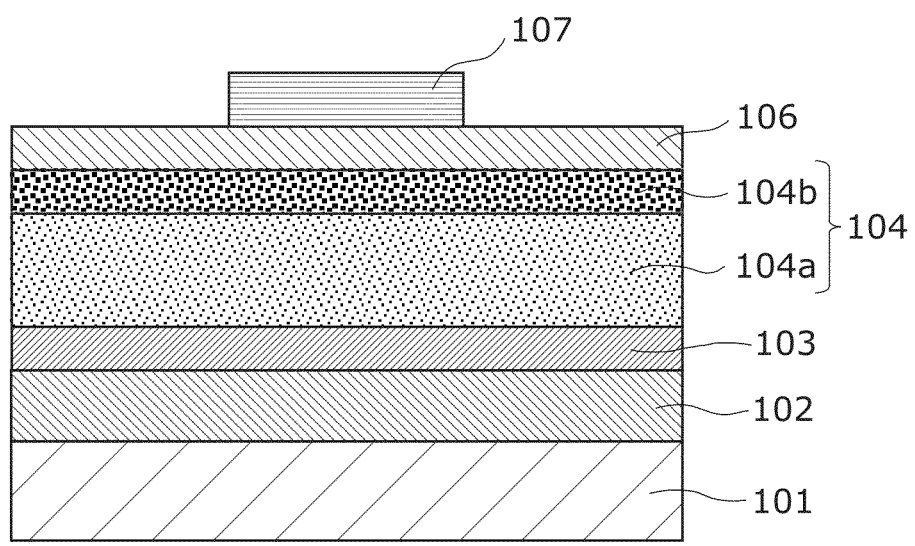
[FIG. 4B]
Figure 4C:
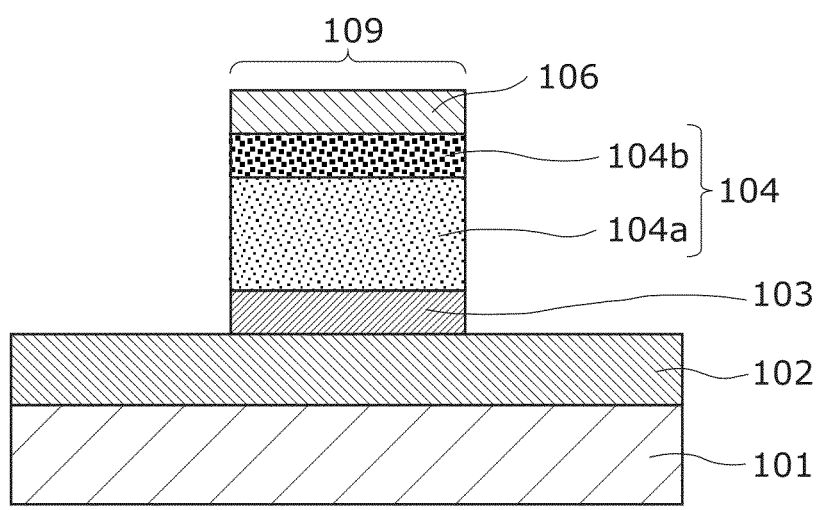
[FIG. 4C]

Next, a photoresist pattern 107 is formed by photolithography as shown in FIG. 4B. Next, an element region 109 is formed by dry-etching using the photoresist pattern 107 as a mask as shown in FIG. 4C.

Figure 4D:
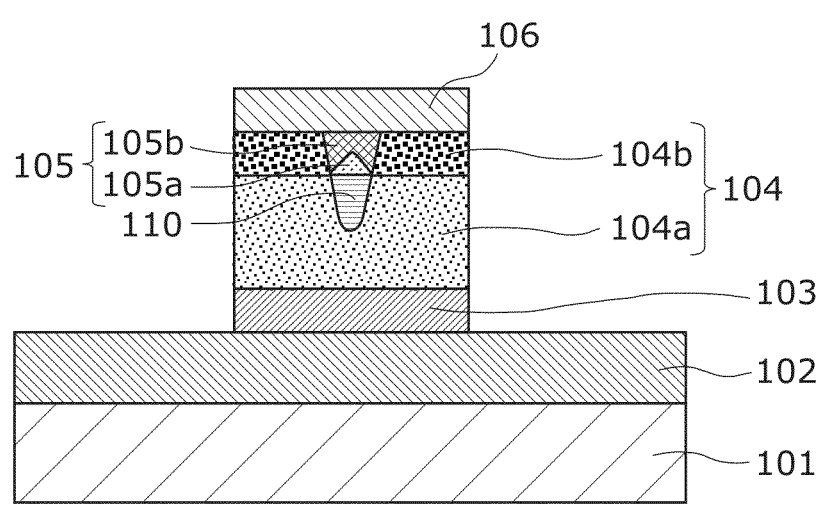
[FIG. 4D]

Next, the local region 105 and the oxygen reservoir region 110 are formed in the variable resistance layer 104 by applying an initial breakdown voltage between the electrodes, that is, the first electrode 103 and the second electrode 106 as shown in FIG. 4D. An exemplary range of voltages to form the local region 105 and the oxygen reservoir region 110 will be described below using FIG. 5.

Figure 5:
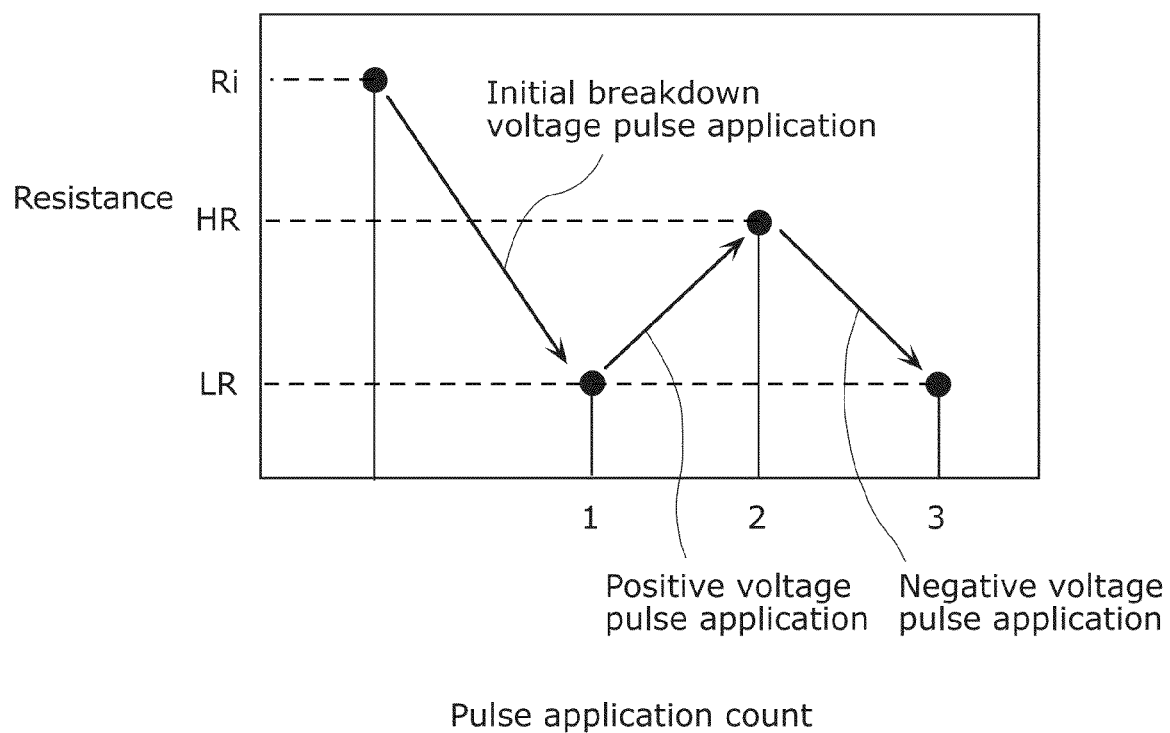
[FIG. 5]

The resistance status of the nonvolatile memory element 100 having an initial resistance (a resistance higher than a resistance HR in the high resistance state, for example, a resistance in a range from $10^7$ to $10^8 \Omega$) as shown in FIG. 5 is changed by applying an initial breakdown voltage between the electrodes. Subsequently, the resistance of the variable resistance layer 104 is changed as shown in FIG. 5 by applying two types of voltage pulses in turn as write voltage between the first electrode 103 and the second electrode 106 of the nonvolatile memory element 100. For example, the two types of voltage pulses have a pulse width of 100 ns and different polarities. More specifically, when a negative voltage pulse having a pulse width of 100 ns is applied between the electrodes as write voltage, resistance of the variable resistance layer 104 decreases from a high resistance HR to a low resistance LR. When a positive voltage pulse having a pulse width of 100 ns is applied between the electrodes as write voltage, resistance of the variable resistance layer 104 increases from the low resistance LR to the high resistance HR. It should be noted that the polarity of the voltage pulse in the present Description is positive when the potential of the second electrode 106 is higher than the potential of the first electrode 103, and negative when the potential of the second electrode 106 is lower than the potential of the first electrode 103.

In this configuration, the second local region 105b in the second oxide layer 104b still dominates the resistance of the nonvolatile memory element 100 even after oxygen in the second oxide layer 104b moves to the first oxide layer 104a as a result of application of initial breakdown voltage. Being free from a parasitic resistance effect, the nonvolatile memory element has stable reversible resistance change characteristics.

[Embodiment 2]

The nonvolatile memory element according to above-described Embodiment 1 is applicable to nonvolatile memory devices in various embodiments. When the nonvolatile memory element is applied to a nonvolatile memory device, the nonvolatile memory device has less variation in resistance change characteristics. Accordingly, the nonvolatile memory device stably operates even when the nonvolatile memory device has a large capacity. A nonvolatile memory device according to Embodiment 2 is a nonvolatile memory device including the nonvolatile memory element according to Embodiment 1. More specifically, the nonvolatile memory device according to Embodiment 2 is a crosspoint nonvolatile memory device having the nonvolatile memory elements according to Embodiment 1 interposed between a plurality of word lines and a plurality of bit lines at (three-dimensional) crosspoints between the plurality of word lines and the plurality of bit lines.

[Configuration of Nonvolatile Memory Device]

Figure 6:
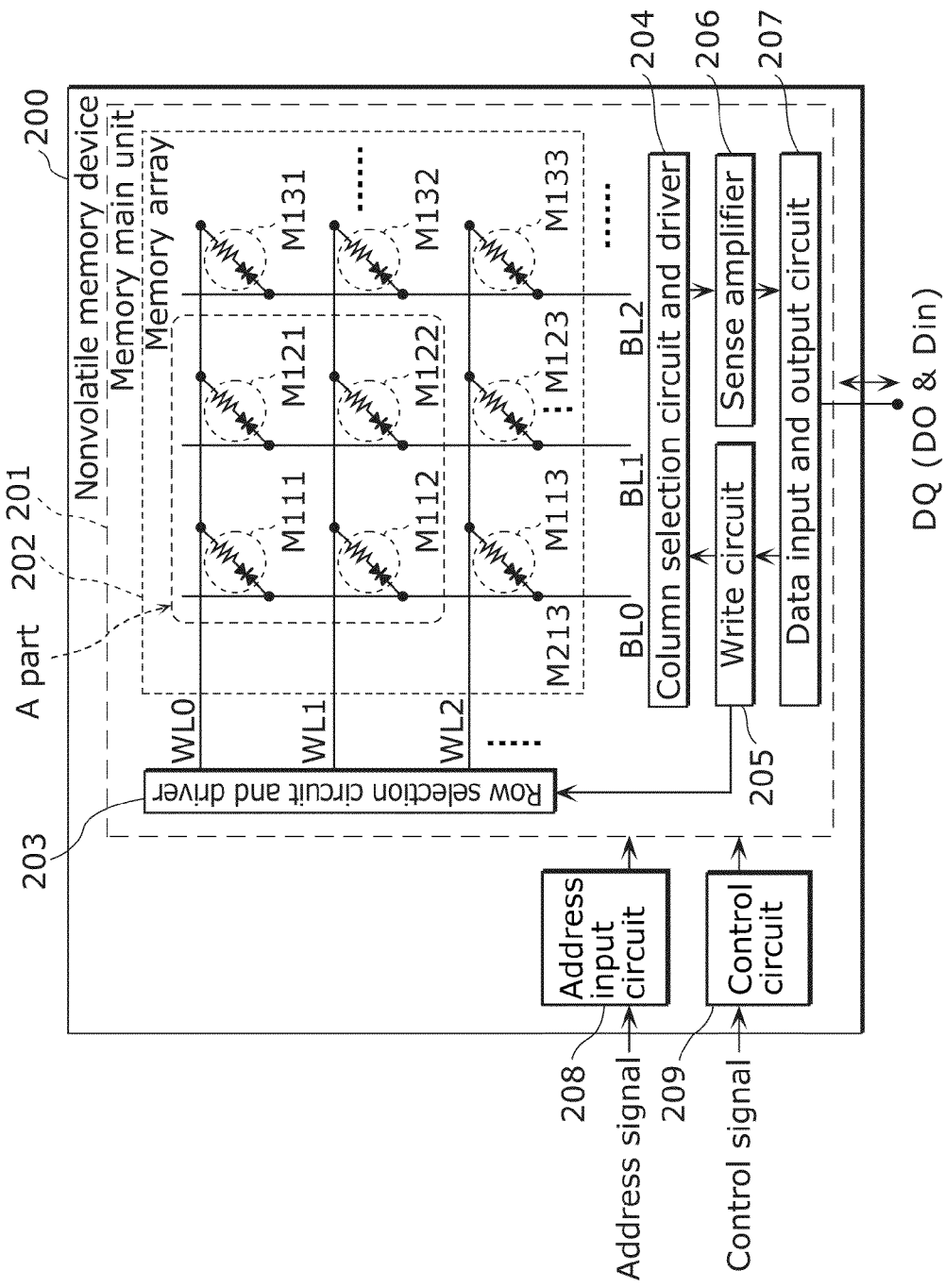
[FIG. 6]
Figure 7:
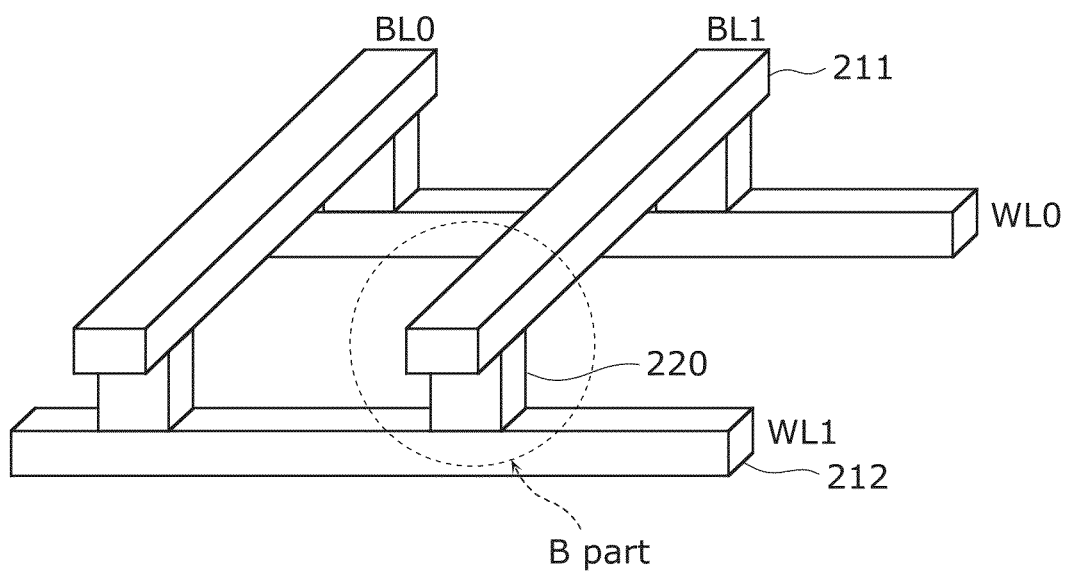
[FIG. 7]

FIG. 6 is a block diagram illustrating a configuration of a nonvolatile memory device 300 according to Embodiment 2 of the present invention. FIG. 7 is a perspective view illustrating a configuration of an A part (configuration for four bits) indicated in FIG. 6.

As shown in FIG. 6, a nonvolatile memory device 200 according to Embodiment 2 includes a semiconductor substrate and a memory main unit 201 on the semiconductor substrate. The memory main unit 201 includes a memory array 202, a row selection circuit and driver 203, a column selection circuit and driver 204, a write circuit 205 for data writing, a sense amplifier 206 which detects the amount of current flowing in a selected bit line, and a data input and output circuit 207 which inputs and outputs data through a terminal DQ.

The nonvolatile memory device 200 further includes an address input circuit 208 for receiving an externally input address signal and a control circuit 209 which controls operation of the memory main unit 201 based on an externally input control signal.

As shown in FIG. 6 and FIG. 7, the memory array 202 includes a plurality of word lines WL0, WL1, WL2, . . . and a plurality of bit lines BL0, BL1, BL2, . . . . The word lines WL0, WL1, WL2, . . . are formed in parallel with each other on the semiconductor substrate. The bit lines BL0, BL1, BL2, . . . are formed in parallel with each other, lying in a plane parallel with the main surface of the semiconductor substrate above the word lines WL0, WL1, WL2, . . . . The bit lines BL0, BL1, BL2, . . . three-dimensionally cross the word lines WL0, WL1, WL2, . . . .

At the three-dimensional crosspoints between the word lines WL0, WL1, WL2, . . . and the bit lines BL0, BL1, BL2, . . . provided are memory cells M111, M112, M113, M121, M122, M123, M131, M132, M133, . . . (hereinafter, referred to as "memory cells M111, M112, . . . ") in a matrix on a one-to-one basis.

Each of the memory cells M111, M112, . . . corresponds to the nonvolatile memory element according to Embodiment 1 (the variable resistance element in Embodiment 1). It should be noted that each of the memory cells M111, M112, . . . in Embodiment 2 includes a current steering element having a non-linear current-to-voltage property as described later.

In FIG. 7, each of the memory cells M111, M112, . . . in FIG. 6 is indicated by a reference sign 220.

The address input circuit 208 receives an address signal from an external circuit (not shown) and provides a row address signal to the row selection circuit and driver 203 and a column address signal to the column selection circuit and driver 204 based on the address signal. The address signal indicates an address of a specific memory cell selected from among the memory cells M111, M112, . . . . The row address signal indicates a row address among addresses indicated in the address signal, and the column address signal indicates a column address among addresses indicated in the address signal.

In each data write cycle, the control circuit 209 provides the write circuit 205 with a write signal to instruct the write circuit 205 to apply a write voltage according to input data Din input into the data input and output circuit 207. In each data read cycle, the control circuit 209 provides the column selection circuit and driver 204 with a read signal to instruct the column selection circuit and driver 204 to perform a reading operation.

The row selection circuit and driver 203 receives the row address signal from the address input circuit 208, selects one of the word lines WL0, WL1, WL2, . . . according to the row address signal, and applies a predetermined voltage to the selected word line. The row selection circuit and driver 203 selects one or more memory cells from among the memory cells M111, M112, . . . included in the memory array 202.

The column selection circuit and driver 204 receives the column address signal from the address input circuit 208, selects one of the bit lines BL0, BL1, BL2, . . . according to the column address signal, and applies a write voltage or a read voltage to the selected bit line. The column selection circuit and driver 204 performs data writing by applying a voltage to the memory cell selected by the row selection circuit and driver 203. The column selection circuit and driver 204 performs data reading by detecting a resistance of the memory cell selected by the row selection circuit and driver 203.

Upon receiving a write signal from the control circuit 209, the write circuit 205 provides the row selection circuit and driver 203 with a signal to instruct the row selection circuit and driver 203 to apply a voltage to a selected word line and provides the column selection circuit and driver 204 with a signal to instruct the column selection circuit and driver 204 to apply a write voltage to a selected bit line.

In each data read cycle, the sense amplifier 206 detects the amount of a current flowing in a bit line selected for reading and determines whether or not the value of the read data is "1" or "0". The resultant output date DO is output to an external circuit via the data input and output circuit 207.

It is also possible to provide a multi-layered nonvolatile memory device by three-dimensionally stacking memory arrays in the nonvolatile memory device according to Embodiment 2 shown in FIG. 6 and FIG. 7. The multi-layered memory array configured in this manner serves as an ultra-high capacity nonvolatile memory.

[Configuration of Nonvolatile Memory Element]

Figure 8:
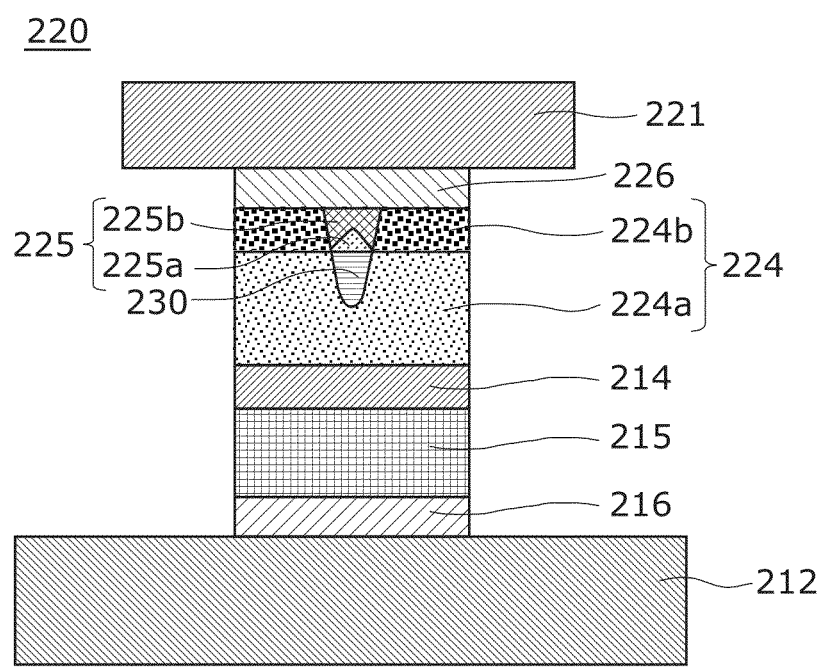
[FIG. 8]

FIG. 8 is a cross-sectional view showing a configuration of a nonvolatile memory element (memory cell in FIG. 6) 220 included in the nonvolatile memory device 200 according to Embodiment 2 of the present invention. FIG. 8 shows the configuration in a B part indicated in FIG. 7.

As shown in FIG. 8, the nonvolatile memory element 220 included in the nonvolatile memory device 200 according to Embodiment 2 connects between a lower line 212 corresponding to the word line WL1 in FIG. 7) and an upper line 211 (corresponding to the bit line BL1 in FIG. 7), and includes a lower electrode 216, a current steering layer 215, an internal electrode 214, a variable resistance layer 224, and an upper electrode 226 stacked in this order. The lower line 212 and upper line 211 are copper lines. The lower electrode 216, current steering layer 215, and internal electrode 214 form a current steering element. The internal electrode 214, variable resistance layer 224, and upper electrode 226 form a variable resistance element.

The variable resistance layer 224 includes: a first oxide layer 224a which includes a p-type metal oxide having non-stoichiometric composition; and a second oxide layer 224b which includes a n-type metal oxide having non-stoichiometric composition and is formed on the first oxide layer 224a.

The variable resistance layer 224 includes a local region 225 having contact with the upper electrode 226, penetrating through the second oxide layer 224b, and having no contact with the internal electrode 214. The local region 225 includes a first local region 225a and a second local region 225b. The first local region 225a is located away from the upper electrode 226 in the local region 225 and has an oxygen content atomic percentage lower than the oxygen content atomic percentage of the second oxide layer 224b. The second local region 225b is located closer to the upper electrode 226 in the local region 225 and has an oxygen content atomic percentage lower than the oxygen content atomic percentage of the second oxide layer 224b.

The first local region 225a is formed so as to have no contact with the internal electrode 214. The second local region 225b is formed in the second oxide layer 224b between the upper electrode 226 and the first local region 225a so as to have contact with the upper electrode 226 and the first local region 225a.

The oxygen reservoir region 230 is formed in the first oxide layer 224a so as to have no contact with the internal electrode 214.

The second local region 225b may be less thick than the second oxide layer 224b. In this configuration, the density of defect sites in the second local region 225b is optimized and variation in resistance change characteristics is thereby reduced.

Here, the internal electrode 214, the variable resistance layer 224, the local region 225, the oxygen reservoir region 230, and the upper electrode 226 respectively correspond to the first electrode 103, the variable resistance layer 104, the local region 105, the oxygen reservoir region 110, and the second electrode 106 in the nonvolatile memory element 100 according to Embodiment 1 shown in FIG. 1.

The current steering element is a load element serially connected to the variable resistance layer 224 via the internal electrode 214. The current steering element is typically a diode, showing a non-linear current-to-voltage property. Furthermore, when the variable resistance element is a bipolar variable resistance element which changes between resistance states according to the polarity of an electric signal, the current steering element may be configured to show a bi-directional current-to-voltage property such that the current steering element becomes conductive as a result of decrease in resistance of the current steering element upon application of a voltage having an amplitude greater than or equal to a predetermined threshold voltage Vf (for example, +1 V or −1 V with respect to a voltage of one of its electrodes).

[Operation of Nonvolatile Memory Device]

An exemplary operation of the nonvolatile memory device according to Embodiment 2 will be described below with reference to a timing diagram shown in FIG. 9, in this operation, data is written in a write cycle and read in a read cycle.

Figure 9:
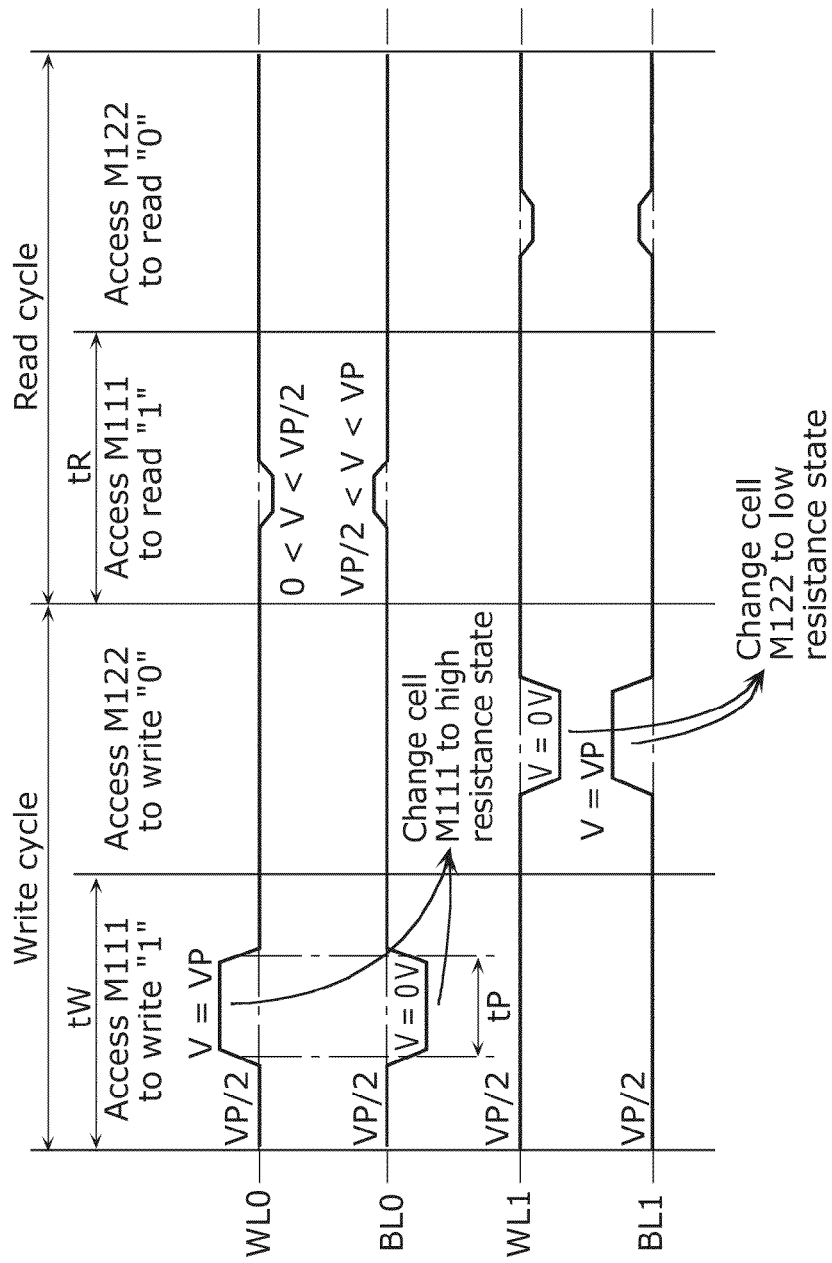
[FIG. 9]

FIG. 9 is a timing diagram showing exemplary operation of the nonvolatile memory device 200 according to Embodiment 2 of the present invention. In the exemplary operation, a data value is "1" when the variable resistance layer 224 is in a high resistance state, and a data value is "0" when the variable resistance layer 224 is in a low resistance state. The following describes only writing and reading of data to and from the memory cells M111 and M122 for illustrative purposes.

In FIG. 9, VP denotes the amplitude of a pulse voltage necessary for changing resistance of the memory cells each including a variable resistance element and a current steering element. Here, there may be a relation that VP/2 is lower than a threshold voltage Vf. This is because when a voltage applied to an unselected memory cell is VP/2, the current steering element of the unselected memory cell remains non-conductive and leakage of a current into the unselected memory cell can be prevented. As a result, wasteful current flow into memory cells to which data is not to be written is prevented, and thereby consumption current can be further lowered. Moreover, this also produces an advantageous effect that unintended writing of data to unselected memory cells (generally referred to as disturbance) is prevented. A voltage of VP is applied to a selected memory cell, having a relation that the threshold voltage Vf is lower than VP.

In FIG. 9, tW denotes a write cycle period which is time taken to perform one write cycle, and tR denotes a read cycle period which is time taken to perform one read cycle.

In the write cycle of the memory cell M111, a pulse voltage VP having a pulse width of tP is applied to the word line WL0, and a voltage of 0 V is concurrently applied to the bit line BL0. Consequently, a write voltage for writing a data value of "1" to the memory cell M111 is applied to the memory cell M111, and thereby the variable resistance layer 324 of the memory cell M211 is changed to a high resistance state. In other words, the data value of "1" is thereby written to the memory cell M111.

Next, in the write cycle of the memory cell M122, a voltage of 0 V having a pulse width of tP is applied to the word line WL1, and a pulse voltage VP is concurrently applied to the bit line BL1. Consequently, a write voltage for writing a data value of "0" to the memory cell M122 is applied to the memory cell M122, and thereby the variable resistance layer 224 of the memory cell M122 is changed to a low resistance state. In other words, the data value of "0" is thereby written to the memory cell M122.

In the read cycle of the memory cell M111, a pulse voltage having an amplitude smaller than the pulse for writing and a value greater than 0 V and smaller than VP/2 is applied to the word line WL0. In addition, a pulse voltage having an amplitude smaller than the pulse in the writing and a value greater than VP/2 and smaller than VP is concurrently applied to the bit line BL0. This read voltage is denoted by Vread. First, the read voltage Vread which is higher than the threshold voltage Vf and lower than VP is applied to the memory cell M111, so that a current which corresponds to the resistance value of the variable resistance layer 224 of the memory cell M111 in a high resistance state is output. Then, a data value of "1" is read by detecting the value of the output current.

Next, in the read cycle of the memory cell M122, a voltage which is the same as the voltage in the read cycle of the memory cell M111 is applied to the word line WL1 and the bit line BL1. A current which corresponds to the resistance value of the variable resistance layer 224 of the memory cell M122 in a low resistance state is thereby output. Then, a data value of "0" is read by detecting the value of the output current.

The nonvolatile memory device 200 according to Embodiment 2 includes the nonvolatile memory element 220 which switches between a low resistance state and a high resistance state in such a preferable manner that the nonvolatile memory device 200 can stably operate.

[Embodiment 3]

A nonvolatile memory device according to Embodiment 3 is a nonvolatile memory device including the nonvolatile memory element according to Embodiment 1. More specifically, the nonvolatile memory device according to Embodiment 3 is what is called a 1T1R nonvolatile memory device, which includes one transistor per nonvolatile memory cell.

[Configuration of Nonvolatile Memory Device]

Figure 10:
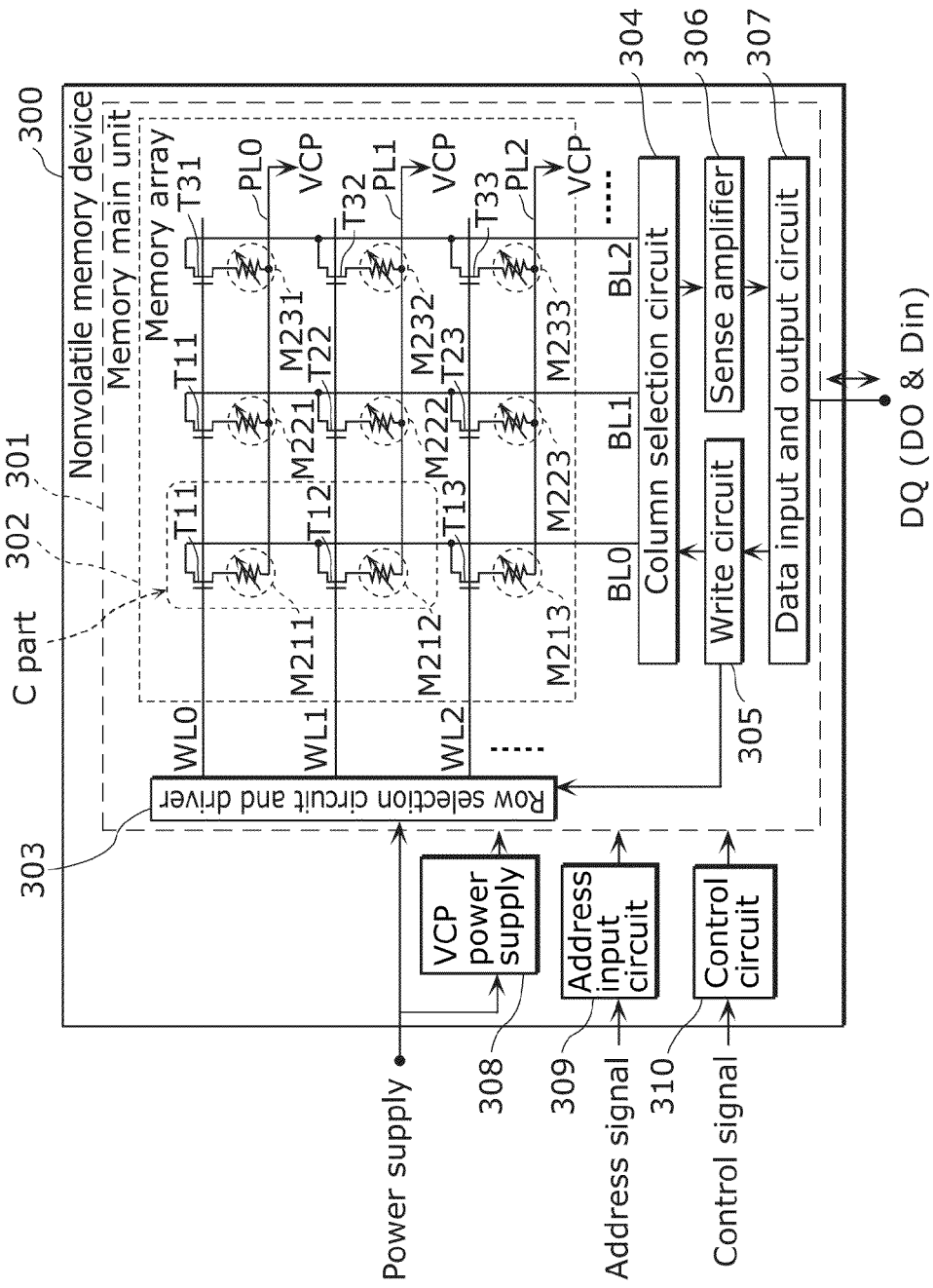
[FIG. 10]
Figure 11:
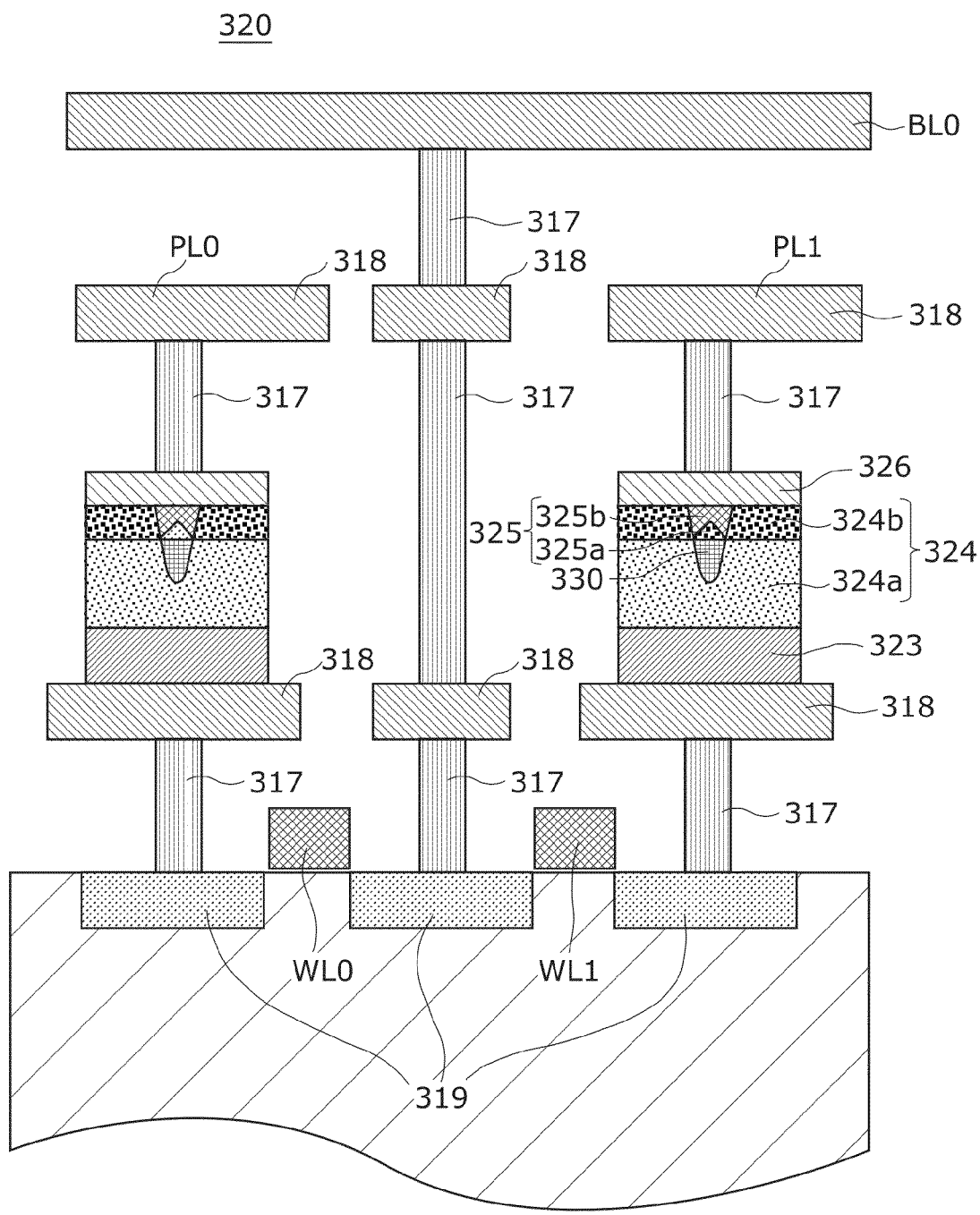
[FIG. 11]

FIG. 10 is a block diagram illustrating a configuration of a nonvolatile memory device 300 according to Embodiment 3 of the present invention. FIG. 11 is a cross-sectional view illustrating a configuration of a C part (configuration for two bits) indicated in FIG. 10.

As shown in FIG. 10, a nonvolatile memory device 300 according to Embodiment 3 includes a semiconductor substrate and a memory main unit 301 on the semiconductor substrate. The memory main unit 301 includes a memory array 302, a row selection circuit and driver 303, a column selection circuit 304, a write circuit 305 for data writing, a sense amplifier 306 which detects the amount of current flowing in a selected bit line to determine whether a data value is "1" or "0", and data input and output circuit 307 which inputs and outputs data through a terminal DQ.

The nonvolatile memory device 300 further includes a cell plate power supply (VCP power supply) 308, an address input circuit 309 for receiving an externally input address signal and a control circuit 310 which controls operation of the memory main unit 301 based on an externally input control signal.

The memory array 302 includes: a plurality of word lines WL0, WL1, WL2, . . . and a plurality of bit lines BL0, BL1, BL2; a plurality of transistors T11, T12, T13, T21, T22, T23, T31, T32, T33 (hereinafter, referred to as "transistors T11, T12, . . . "); and a plurality of memory cells M211, M212, M213, M221, M222, M223, M231, M232, M233 (hereinafter, referred to as "memory cells M211, M212, . . . "). The plurality of word lines WL0, WL1, WL2, . . . and the plurality of bit lines BL0, BL1, BL2, . . . are formed above the semiconductor substrate so as to cross each other. The transistors T11, T12, . . . are provided to correspond to three-dimensional crosspoints between the plurality of word lines WL0, WL1, WL2, . . . and the plurality of bit lines BL0, BL1, BL2, . . . and are respectively connected to the word lines WL0, WL1, WL2, . . . and the bit lines BL0, BL1, BL2, . . . . The memory cells M211, M212, . . . are provided to correspond to the transistors T11, T12, . . . on a one-to-one basis.

Furthermore, the memory array 302 includes a plurality of plate lines PL0, PL1, PL2, . . . arranged in parallel with the word lines WL0, WL1, WL2, . . . .

As shown in FIG. 11, the bit line BL0 lies above the word lines WL0 and WL1, and the plate lines PL0 and PL1 lie between the bit line BL0 and the word lines WL0 and WL1.

Each of the memory cells M211, M212, . . . corresponds to the nonvolatile memory element according to Embodiment 1. More specifically, the nonvolatile memory element 320 in the FIG. 11 corresponds to each of the memory cells M211, M212, . . . in FIG. 10, and the nonvolatile memory element 320 includes an upper electrode 326, a variable resistance layer 324, a local region 325, and a lower electrode 323.

The variable resistance layer 324 includes: a first oxide layer 324*a* which includes a p-type metal oxide having non-stoichiometric composition; and a second oxide layer 324*b* which includes an n-type metal oxide having non-stoichiometric composition and is formed on the first oxide layer 324*a*.

The variable resistance layer 324 includes a local region 325 which is in contact with the upper electrode 326, penetrates through the second oxide layer 324*b*, and has no contact with the lower electrode 323. The local region 325 includes a first local region 325*a* and a second local region 325*b*. The first local region 325*a* is located away from the upper electrode 236 in the local region 325 and has an oxygen content atomic percentage lower than the oxygen content atomic percentage of the second oxide layer oxygen 324*b*. The second local region 325*b* is located closer to the upper electrode 326 in the local region 325 and has an oxygen content atomic percentage lower than the oxygen content atomic percentage of the second oxide layer 324*b*.

The first local region 325*a* is formed so as to have no contact with the lower electrode 323. The second local region 325*b* is formed in the second oxide layer 324*b* between the upper electrode 326 and the first local region 325*a* so as to have contact with the upper electrode 326 and the first local region 325*a*.

The oxygen reservoir region 330 is formed on the first oxide layer 324*a* so as to have no contact with the lower electrode 323.

The second local region 325*b* may be less thick than the second oxide layer 324*b*. In this configuration, the density of defect sites in the second local region 325*b* is optimized and variation in resistance change characteristics is thereby reduced.

Here, the upper electrode 326, the variable resistance layer 324, the local region 325, the oxygen reservoir region 330, and the lower electrode 323 respectively correspond to the first electrode 103, the variable resistance layer 104, the local region 105, the oxygen reservoir region 110, and the second electrode 106 in the nonvolatile memory element 100 according to Embodiment 1 as shown in FIG. 1.

In FIG. 11, the reference sign 317 denotes a plug layer, the reference sign 318 denotes a metal wiring layer, and the reference sign 319 denotes source-drain regions.

As shown in FIG. 10, each of the transistors T11, T12, T13, . . . has a drain connected to the bit line BL0, each of the transistors T21, T22, T23, . . . has a drain connected to the bit line BL1, and each of the transistors T31, T32, T33, . . . has a drain connected to the bit line BL2.

Also as shown in FIG. 10, each of the transistors T11, T21, T31, . . . has a gate connected to the word line WL0, each of the transistors T12, T22, T32, . . . has a gate connected to the word line WL1, and each of the transistors T13, T23, T33, . . . has a gate connected to the word line WL2.

Furthermore, each of the transistors T11, T12, . . . has a source connected to the memory cells M211, M212, . . . , respectively.

Furthermore, the memory cells M211, M221, M231, . . . are connected to the plate line PL0, the memory cells M212, M222, M232, . . . are connected to the plate line PL1, and the memory cells M213, M223, M233, . . . are connected to the plate line PL2.

The address input circuit 309 receives an address signal from an external circuit (not shown) and provides a row address signal to the row selection circuit and driver 303 and a column address signal to the column selection circuit 304 based on the address signal. The address signal indicates an address of a specific memory cell selected from among the memory cells M211, M212, . . . . The row address signal indicates a row address among addresses indicated in the address signal, and the column address signal indicates a column address among addresses indicated in the address signal.

In each data write cycle, the control circuit 310 provides the write circuit 305 with a write signal to instruct the write circuit 305 to apply a write voltage according to input data Din input into the data input and output circuit 307. In each data read cycle, the control circuit 310 provides the column selection circuit 304 with a read signal to instruct the column selection circuit 304 to apply a read voltage.

The row selection circuit and driver 303 receives the row address signal from the address input circuit 309, selects one of the word lines WL0, WL1, WL2, . . . according to the row address signal, and applies a predetermined voltage to the selected word line. The row selection circuit and driver 303 selects one or more memory cells from among the memory cells M213, M223, M233, . . . included in the memory array 302.

The column selection circuit 304 receives the column address signal from the address input circuit 309, selects one of the bit lines BL0, BL1, BL2, . . . according to the column address signal, and applies a write voltage or a read voltage to the selected bit line. The column selection circuit 304 performs data writing by applying a voltage to the memory cell selected by the row selection circuit and driver 303. The column selection circuit 304 performs data reading by detecting a resistance of the memory cell selected by the row selection circuit and driver 303.

Upon receiving a write signal from the control circuit 310, the write circuit 305 provides the column selection circuit 304 with a signal to instruct the column selection circuit 304 to apply a write voltage to a selected bit line.

In each data read cycle, the sense amplifier 306 detects the amount of a current flowing in a bit line selected for reading and determines whether or not the value of the read data is "1" or "0". The resultant output date DO is output to an external circuit via the data input and output circuit 307.

The nonvolatile memory device including one transistor per nonvolatile memory cell according to Embodiment 3 has a small memory capacity compared to the crosspoint nonvolatile memory device according to Embodiment 2. However, since the nonvolatile memory device according to Embodiment 3 need not include a current steering element such as a diode, the nonvolatile memory device according to Embodiment 3 has the advantage that the CMOS process is easily applicable to the nonvolatile memory device according to Embodiment 3, and the advantage that control of operation of the nonvolatile memory device according to Embodiment 3 is easy.

[Exemplary Operation of Nonvolatile Memory Device]

Exemplary operation of the nonvolatile memory device 300 according to Embodiment 3 will be described below with reference to a timing diagram shown in FIG. 12. In this operation, data is written in a write cycle and read in a read cycle.

Figure 12:
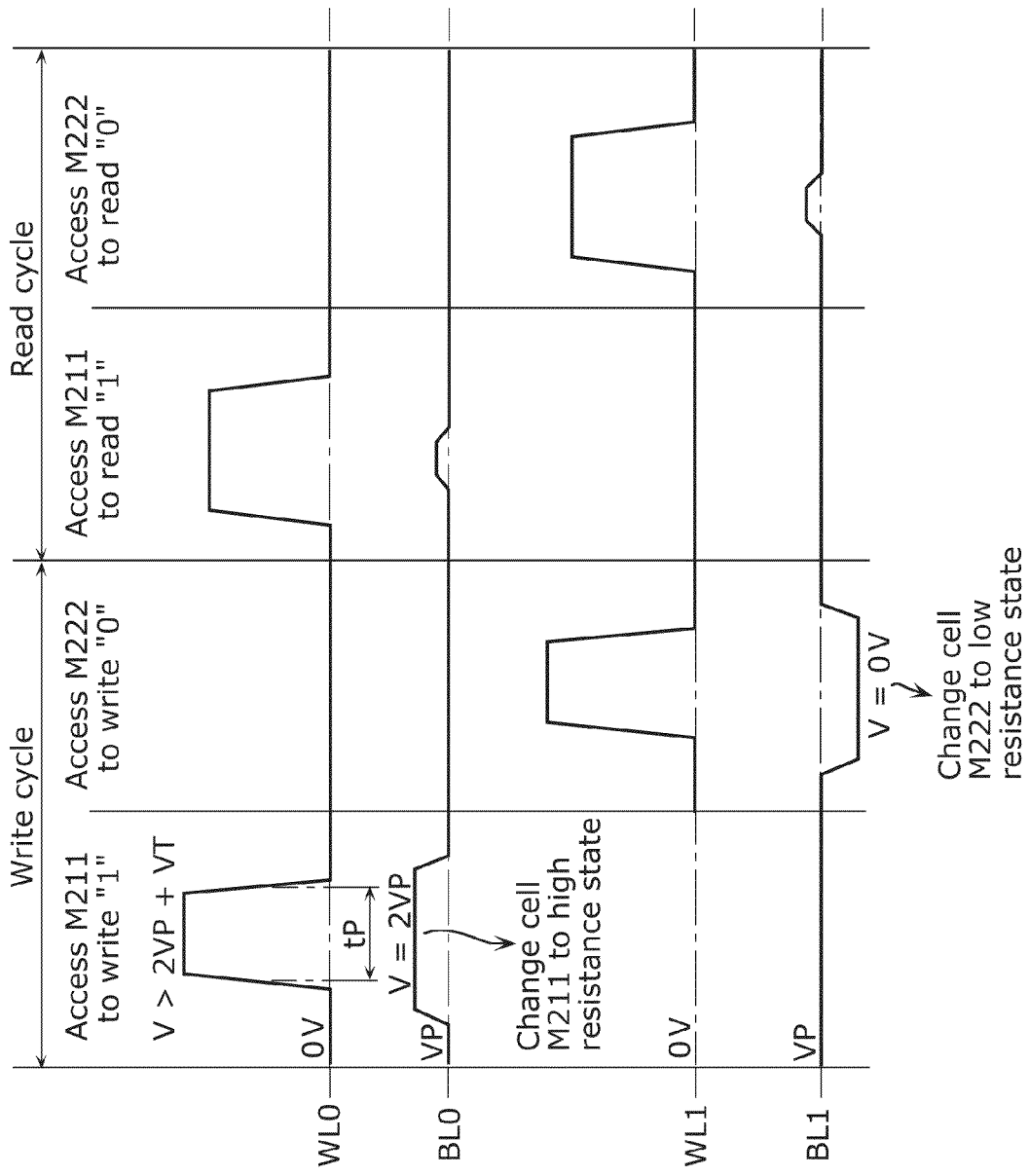
[FIG. 12]

FIG. 12 is a timing diagram showing exemplary operation of the nonvolatile memory device 300 according to Embodiment 3 of the present invention. In the exemplary operation, a data value is "1" when the variable resistance layer 324 is in a high resistance state, and a data value is "0" when the variable resistance layer 324 is in a low resistance state. The following describes only writing and reading of data to and from the memory cells M211 and M222 for illustrative purposes.

In FIG. 12, VP denotes a pulse voltage necessary for changing resistance of the variable resistance elements, and VT denotes a threshold voltage of the transistors. A voltage VP is constantly applied to the plate lines. The bit lines are also precharged to the voltage VP when not selected.

In a write cycle of the memory cell M211, a voltage which has a pulse width of tP and is higher than the total of two times of the pulse voltage VP and the threshold voltage VT of the transistor is applied to the word line WL0. Consequently, the transistor T11 turns ON. Concurrently, two times of the pulse voltage VP is applied to the bit line BL0. Consequently, a write voltage for writing a data value of "1" to the memory cell M211 is applied to the memory cell M211, and thereby the variable resistance layer 324 of the memory cell M211 is changed to a high resistance state. In other words, the data value of "1" is thereby written to the memory cell M211.

Next, in a write cycle of the memory cell M222, a voltage which has a pulse width of tP and is higher than the total of two times of the pulse voltage VP and the threshold voltage VT of the transistor is applied to the word line WL1. Consequently, the transistor T22 turns ON. Concurrently, a voltage of 0 V is applied to the bit line BL1. Consequently, a write voltage for writing a data value of "0" to the memory cell M222 is applied to the memory cell M222, and thereby the variable resistance layer 324 of the memory cell M222 is changed to a low resistance state. In other words, the data value of "0" is thereby written to the memory cell M222.

In the read cycle of the memory cell M211, a predetermined voltage to turn the transistor T11 is applied to the word line WL0, and a pulse voltage having an amplitude smaller than the pulse width for the writing is concurrently applied to the bit line BL0. A current which corresponds to the resistance value of the variable resistance layer 324 of the memory cell M211 in a high resistance state is thereby output. Then, a data value of "1" is read by detecting the value of the output current.

Next, in the read cycle of the memory cell M222, a voltage which is the same as the voltage in the read cycle of the memory cell M211 is applied to the word line WL1 and the bit line BL1. A current which corresponds to the resistance value of the variable resistance layer 324 of the memory cell M222 in a low resistance state is thereby output. Then, a data value of "0" is read by detecting the value of the output current.

As is the case described in Embodiment 2, the nonvolatile memory device 300 according to Embodiment 3 includes the nonvolatile memory element 320 which switches between a low resistance state and a high resistance state in such a preferable manner that the nonvolatile memory device 300 can stably operate.

The method of manufacturing the nonvolatile memory elements in the above-described embodiments is not limited to aspects of the above-described embodiments. In other words, for electronic devices having variable resistance elements, the nonvolatile memory elements in the above-described embodiments can be manufactured using either the above-described method or a method which is a combination of the above-described method and any known method.

The present invention is not limited to the above-described embodiments used as a basis of the description of the nonvolatile memory element and nonvolatile memory device according to the present invention. The present invention also includes variations of the embodiment conceived by those skilled in the art unless they depart from the spirit and scope of the present invention. The present invention also includes a different embodiment where the components in the embodiments above are used in any combination unless they depart from the spirit and scope of the present invention.

For example, the positions of the first oxide layer 104a and the second oxide layer 104b in the layered structure of the variable resistance element in the above-described embodiments may be interchanged. Furthermore, the layers in the layered structure in the above-described embodiments may be embedded in a contact hole.

Furthermore, each nonvolatile memory element 100 in the above-described embodiments may have a plurality of the local region 105 and a plurality of the oxygen reservoir region 110.

Furthermore, the plate lines (source lines) lying in parallel with the word lines in the above-described embodiments may be arranged parallel with the bit lines. Furthermore, the plate lines which set the transistors at a common potential in the above-described embodiments may be provided with a plate line selection circuit and driver having the same configuration as the row selection circuit and driver. In this configuration, plate lines selected and plate lines not selected are driven at different voltages (different in levels and/or polarity).

INDUSTRIAL APPLICABILITY

The present invention is applicable to nonvolatile memory elements and nonvolatile memory devices, and particularly to memory elements and memory devices used in electronic devices such as electronic digital appliances, memory cards, personal computers, and mobile computers.

REFERENCE SIGNS LIST 100, 220, 320, 1400 nonvolatile memory element
101 substrate
102 interlayer insulating film
103, 1403 first electrode
104, 224, 324, 1405 variable resistance layer
104a, 224a, 324a first oxide layer
104b, 224b, 324b second oxide layer
105, 225, 325 local region
105a, 225a, 325a first local region
105b, 225b, 325b second local region
106, 1406 second electrode
107 pattern
110, 230, 330 oxygen reservoir region
200, 300 nonvolatile memory device
201, 301 memory main unit
202, 302 Memory array
203, 303 row selection circuit and driver
204 column selection circuit and driver
205, 305 write circuit
206, 306 sense amplifier
207, 307 Data input and output circuit
208 address input circuit
209, 310 control circuit
211 upper line
212 lower line
214 internal electrode
215 current steering layer
216, 323 lower electrode
226, 326 Upper electrode
304 column selection circuit
308 VCP power supply
309 address input circuit
317 plug layer
318 metal wiring layer
319 source-drain region
1405c filament
BL0, BL1, . . . bit line
T11, T12, . . . transistor
M111, M112, . . . memory cell
M211, M212, . . . memory cell
PL0, PL1, . . . plate line
WL0, WL1, . . . word line

The invention claimed is:

1. A variable resistance nonvolatile memory element comprising:
   a first electrode;
   a second electrode; and
   a variable resistance layer which is interposed between the first electrode and the second electrode and capable of reversibly switching between a high resistance state and a low resistance state based on a polarity of a voltage applied between the first electrode and the second electrode,
   wherein the variable resistance layer includes:
   a first oxide layer comprising a metal oxide having non-stoichiometric composition and including p-type carriers;
   a second oxide layer located between and in contact with the first oxide layer and the second electrode and comprising a metal oxide having non-stoichiometric composition and including n-type carriers;
   an oxygen reservoir region located in the first oxide layer, having no contact with the first electrode, and having an oxygen content atomic percentage higher than an oxygen content atomic percentage of the first oxide layer; and
   a local region located in the second oxide layer, having contact with the oxygen reservoir region, and having an oxygen content atomic percentage lower than an oxygen content atomic percentage of the second oxide layer.

2. The variable resistance nonvolatile memory element according to claim 1, wherein the local region includes:
   a first local region having contact with the oxygen reservoir region; and
   a second local region located between and in contact with the second electrode and the first local region, and
   the second local region has an oxygen content atomic percentage higher than an oxygen content atomic percentage of the first local region.

3. The variable resistance nonvolatile memory element according to claim 1,
   wherein the first oxide layer is a metal-deficient oxide or an oxygen-excessive oxide.

4. The variable resistance nonvolatile memory element according to claim 1,
   wherein the second oxide layer is an oxygen-deficient oxide or a metal-excessive oxide.

5. The variable resistance nonvolatile memory element according to claim 1,
   wherein the second oxide layer is thinner than the first oxide layer.

6. The variable resistance nonvolatile memory element according to claim 1,
   wherein the first oxide layer comprises an oxide of a metal which is nickel, the oxide having non-stoichiometric composition.

7. The variable resistance nonvolatile memory element according to claim 1,
   wherein the second oxide layer is an oxide of a metal which is tantalum, the oxide having non-stoichiometric composition.

8. The variable resistance nonvolatile memory element according to claim 1,
   wherein the first electrode and the second electrode comprise a same material.

9. The variable resistance nonvolatile memory element according to claim 1, further comprising
   a load element electrically connected to the variable resistance layer.

10. The variable resistance nonvolatile memory element according to claim 9,
    wherein the load element is one of a fixed resistor, a transistor, and a diode.

11. The variable resistance nonvolatile memory element according to claim 1,
    wherein the local region formed in the variable resistance layer is a single local region in the variable resistance layer.

12. A nonvolatile memory device comprising:
    a substrate;
    a plurality of first lines formed in parallel with each other on the substrate;
    a plurality of second lines formed in parallel with each other in a plane above the plurality of first lines and three-dimensionally crossing the plurality of first lines, the plane being parallel with a main surface of the substrate;
    a memory cell array including a plurality of the nonvolatile memory elements each of which is the nonvolatile memory element according to claim 1 and is provided to a corresponding one of three-dimensional crosspoints between the plurality of first lines and the plurality of second lines;
    a selection circuit which selects at least one nonvolatile memory element from among the nonvolatile memory elements included in the memory cell array;
    a write circuit which writes data to the nonvolatile memory element selected by the selection circuit, by applying a voltage to the selected nonvolatile memory element; and
    a read circuit which reads data by detecting a resistance value of the nonvolatile memory element selected by the selection circuit.

13. The nonvolatile memory device according to claim 12, wherein the nonvolatile memory element includes a current steering element electrically connected to the variable resistance layer.

14. A nonvolatile memory device comprising:
    a substrate;
    a memory cell array including:
        a plurality of word lines and a plurality of bit lines formed above the substrate;
        a plurality of transistors each connected to a corresponding one of the word lines and a corresponding one of the bit lines; and
        a plurality of nonvolatile memory elements each of which is the nonvolatile memory element according to claim 1 and is provided to a corresponding one of the transistors on a one-to-one basis;
    a selection circuit which selects at least one nonvolatile memory element from among the nonvolatile memory elements included in the memory cell array;
    a write circuit which writes data to the nonvolatile memory element selected by the selection circuit, by applying a voltage to the selected nonvolatile memory element; and
    a read circuit which reads data by detecting a resistance value of the nonvolatile memory element selected by the selection circuit.

* * * * *